United States Patent
Lin et al.

(10) Patent No.: US 10,919,760 B2
(45) Date of Patent: Feb. 16, 2021

(54) PROCESS FOR NANO GRAPHENE PLATELET-REINFORCED COMPOSITE MATERIAL

(71) Applicant: Nanotek Instruments, Inc., Dayton, OH (US)

(72) Inventors: Yi-jun Lin, Taoyuan (TW); Aruna Zhamu, Springboro, OH (US); Bor Z. Jang, Centerville, OH (US)

(73) Assignee: Global Graphene Group, Inc., Dayton, OH (US)

( * ) Notice: Subject to any disclaimer, the term of this patent is extended or adjusted under 35 U.S.C. 154(b) by 193 days.

(21) Appl. No.: 16/108,233

(22) Filed: Aug. 22, 2018

(65) Prior Publication Data
US 2019/0002278 A1 Jan. 3, 2019

Related U.S. Application Data

(63) Continuation of application No. 13/815,246, filed on Feb. 14, 2013, now Pat. No. 10,087,073.

(51) Int. Cl.
*B82Y 30/00* (2011.01)
*H01L 23/373* (2006.01)

(52) U.S. Cl.
CPC .......... *B82Y 30/00* (2013.01); *H01L 23/373* (2013.01); *H01L 23/3735* (2013.01); *H01L 23/3737* (2013.01); *H01L 2924/0002* (2013.01); *Y10S 977/833* (2013.01)

(58) Field of Classification Search
CPC ............... B82Y 30/00; H01L 23/3737; H01L 2924/0002; H01L 23/3735; H01L 23/373; H01L 2924/00; Y10S 977/833
See application file for complete search history.

(56) References Cited

U.S. PATENT DOCUMENTS

| | | |
|---|---|---|
| 2,798,878 A | 7/1957 | Hummers |
| 3,179,634 A | 4/1965 | Murray |
| 3,404,061 A | 10/1968 | Shane et al. |
| 3,413,441 A | 11/1968 | Kosaku et al. |
| 4,666,736 A | 5/1987 | Matsumura et al. |
| 5,761,256 A | 6/1998 | Inoue et al. |
| 5,831,374 A | 11/1998 | Morita et al. |

(Continued)

FOREIGN PATENT DOCUMENTS

| | | |
|---|---|---|
| DE | 3918140 A1 | 2/1990 |
| DE | 202005001198 U1 | 6/2005 |

(Continued)

OTHER PUBLICATIONS

U.S. Appl. No. 13/694,161 Response to nfOA dated Aug. 15, 2017, 12 pages.

(Continued)

*Primary Examiner* — Vishal I Patel

(57) ABSTRACT

A process for producing a nanographene platelet-reinforced composite material having nanographene platelets or sheets (NGPs) as a first reinforcement phase dispersed in a matrix material and the first reinforcement phase occupies a weight fraction of 1-90% based on the total composite weight. Preferably, these NGPs, alone or in combination with a second reinforcement phase, are bonded by an adhesive and constitute a continuous 3-D network of electron- and phonon-conducting paths.

18 Claims, 12 Drawing Sheets

(56) References Cited

U.S. PATENT DOCUMENTS

| | | |
|---|---|---|
| 6,482,520 B1 | 11/2002 | Tzeng |
| 6,503,626 B1 | 1/2003 | Norley et al. |
| 6,538,892 B2 | 3/2003 | Smalc |
| 6,771,502 B2 | 8/2004 | Getz et al. |
| 6,982,874 B2 | 1/2006 | Smalc et al. |
| 7,071,258 B1 | 7/2006 | Jang et al. |
| 7,138,029 B2 | 11/2006 | Norley et al. |
| 7,150,914 B2 | 12/2006 | Clovesko et al. |
| 7,160,619 B2 | 1/2007 | Clovesko et al. |
| 7,166,237 B2 | 1/2007 | Klett et al. |
| 7,292,441 B2 | 11/2007 | Smalc et al. |
| 7,306,847 B2 | 12/2007 | Capp et al. |
| 7,385,819 B1 | 6/2008 | Shives et al. |
| 7,566,410 B2 | 7/2009 | Song et al. |
| 7,662,321 B2 | 2/2010 | Guo et al. |
| 8,105,565 B2 | 1/2012 | Nishikawa et al. |
| 8,173,095 B2 | 5/2012 | Heer et al. |
| 8,226,801 B2 | 7/2012 | Zhamu et al. |
| 8,574,720 B2 | 11/2013 | Carney et al. |
| 8,778,538 B2 | 7/2014 | Kung et al. |
| 9,156,700 B2 | 10/2015 | Zhamu et al. |
| 9,193,132 B2 | 11/2015 | Zhamu et al. |
| 9,208,920 B2 | 12/2015 | Zhamu et al. |
| 9,233,850 B2 | 1/2016 | Jang et al. |
| 9,359,208 B2 | 6/2016 | Zhamu et al. |
| 9,360,905 B2 | 6/2016 | Zhamu et al. |
| 9,363,932 B2 | 6/2016 | Wang et al. |
| 9,533,889 B2 | 1/2017 | Zhamu et al. |
| 9,561,955 B2 | 2/2017 | Zhamu et al. |
| 9,833,913 B2 | 12/2017 | Jang et al. |
| 9,835,390 B2 | 12/2017 | Zhamu et al. |
| 9,899,120 B2 | 2/2018 | Zhamu et al. |
| 2002/0076614 A1 | 6/2002 | Yoon et al. |
| 2002/0166654 A1 | 11/2002 | Smalc |
| 2002/0166658 A1 | 11/2002 | Norley et al. |
| 2003/0047302 A1 | 3/2003 | Hebel et al. |
| 2003/0116312 A1 | 6/2003 | Krassowski et al. |
| 2004/0063900 A1 | 4/2004 | Kaneshiro et al. |
| 2004/0127621 A1 | 7/2004 | Drzal et al. |
| 2005/0111189 A1 | 5/2005 | Smalc et al. |
| 2005/0271574 A1 | 12/2005 | Jang et al. |
| 2006/0035085 A1 | 2/2006 | Ozaki et al. |
| 2006/0056157 A1 | 3/2006 | Ford et al. |
| 2006/0086493 A1 | 4/2006 | Fujiwara et al. |
| 2006/0094881 A1 | 5/2006 | Ewanicki et al. |
| 2006/0126304 A1 | 6/2006 | Smalc et al. |
| 2006/0216222 A1 | 9/2006 | Jang |
| 2007/0053168 A1 | 3/2007 | Sayir et al. |
| 2007/0158050 A1 | 7/2007 | Norley et al. |
| 2008/0038565 A1 | 2/2008 | Komada et al. |
| 2008/0048152 A1 | 2/2008 | Jang et al. |
| 2008/0062651 A1 | 3/2008 | Reis et al. |
| 2008/0202386 A1 | 8/2008 | Hougham et al. |
| 2008/0206124 A1 | 8/2008 | Jang et al. |
| 2008/0248275 A1 | 10/2008 | Jang et al. |
| 2009/0022649 A1 | 1/2009 | Zhamu et al. |
| 2009/0028777 A1 | 1/2009 | Zhamu et al. |
| 2009/0028778 A1 | 1/2009 | Zhamu et al. |
| 2009/0061191 A1 | 3/2009 | Zhamu et al. |
| 2009/0087493 A1 | 4/2009 | Dai et al. |
| 2009/0155561 A1 | 6/2009 | Choi et al. |
| 2009/0155578 A1 | 6/2009 | Zhamu et al. |
| 2009/0173334 A1 | 7/2009 | KRS et al. |
| 2009/0305135 A1* | 12/2009 | Shi ................... H01M 4/625 429/217 |
| 2009/0325071 A1 | 12/2009 | Verbrugge et al. |
| 2010/0000441 A1 | 1/2010 | Jang et al. |
| 2010/0040796 A1 | 2/2010 | Chueh |
| 2010/0044646 A1 | 2/2010 | Zhamu et al. |
| 2010/0055025 A1 | 3/2010 | Jang et al. |
| 2010/0055458 A1 | 3/2010 | Jang et al. |
| 2010/0055464 A1 | 3/2010 | Sung |
| 2010/0085713 A1 | 4/2010 | Balandin et al. |
| 2010/0126660 A1 | 5/2010 | O'Hara |
| 2010/0128439 A1 | 5/2010 | Tilak et al. |
| 2010/0140792 A1 | 6/2010 | Haddon et al. |
| 2010/0143798 A1 | 6/2010 | Zhamu et al. |
| 2010/0144904 A1 | 6/2010 | Wang et al. |
| 2010/0176337 A1 | 7/2010 | Zhamu et al. |
| 2010/0196716 A1 | 8/2010 | Ohta et al. |
| 2010/0222482 A1 | 9/2010 | Jang et al. |
| 2010/0255984 A1 | 10/2010 | Sutter et al. |
| 2010/0301279 A1 | 12/2010 | Nesper et al. |
| 2011/0017585 A1 | 1/2011 | Zhamu et al. |
| 2011/0046027 A1 | 2/2011 | Zhamu et al. |
| 2011/0059599 A1 | 3/2011 | Ward et al. |
| 2011/0108978 A1 | 5/2011 | Kim et al. |
| 2011/0159372 A1 | 6/2011 | Zhamu et al. |
| 2011/0183025 A1 | 7/2011 | Funka |
| 2011/0183180 A1 | 7/2011 | Yu et al. |
| 2011/0186789 A1 | 8/2011 | Samulski et al. |
| 2011/0189452 A1 | 8/2011 | Lettow et al. |
| 2011/0226413 A1 | 9/2011 | Zhang et al. |
| 2011/0227000 A1 | 9/2011 | Ruoff et al. |
| 2011/0247795 A1 | 10/2011 | Horng |
| 2011/0249425 A1 | 10/2011 | Aurongzeb et al. |
| 2011/0268647 A1 | 11/2011 | Ivanovici et al. |
| 2011/0274610 A1 | 11/2011 | Paquette et al. |
| 2011/0280787 A1 | 11/2011 | Chen et al. |
| 2011/0318257 A1 | 12/2011 | Sokolov et al. |
| 2012/0021224 A1 | 1/2012 | Everett et al. |
| 2012/0034442 A1 | 2/2012 | Pauzauskie et al. |
| 2012/0128570 A1 | 5/2012 | Krishnaiah et al. |
| 2012/0164433 A1 | 6/2012 | Advincula |
| 2012/0190139 A1 | 7/2012 | Na et al. |
| 2012/0196074 A1 | 8/2012 | Ago et al. |
| 2012/0202056 A1 | 8/2012 | Wolf et al. |
| 2012/0205606 A1 | 8/2012 | Lee et al. |
| 2012/0208008 A1 | 8/2012 | Tour et al. |
| 2012/0211159 A1 | 8/2012 | Hougham et al. |
| 2012/0234524 A1 | 9/2012 | Fan et al. |
| 2012/0270960 A1 | 10/2012 | Felisari et al. |
| 2012/0272868 A1 | 11/2012 | Berry et al. |
| 2012/0308741 A1 | 12/2012 | Kim et al. |
| 2012/0314365 A1 | 12/2012 | Matsumoto et al. |
| 2013/0001068 A1 | 1/2013 | Zhamu et al. |
| 2013/0005917 A1 | 1/2013 | Zhamu et al. |
| 2013/0015409 A1 | 1/2013 | Fugetsu |
| 2013/0059143 A1 | 3/2013 | Liang et al. |
| 2013/0087446 A1 | 4/2013 | Zhamu et al. |
| 2013/0092229 A1 | 4/2013 | Xue et al. |
| 2013/0130037 A1 | 5/2013 | Bol et al. |
| 2013/0136684 A1 | 5/2013 | Wu et al. |
| 2013/0162977 A1 | 6/2013 | Jung et al. |
| 2013/0180912 A1 | 7/2013 | Li |
| 2013/0181166 A1 | 7/2013 | Tetsuka |
| 2013/0190449 A1 | 7/2013 | Kinloch et al. |
| 2013/0200300 A1 | 8/2013 | Hoe et al. |
| 2013/0213630 A1 | 8/2013 | John |
| 2013/0230722 A1 | 9/2013 | Fujii et al. |
| 2013/0236715 A1 | 9/2013 | Zhamu et al. |
| 2013/0264041 A1 | 10/2013 | Zhamu et al. |
| 2013/0272951 A1 | 10/2013 | Hiura et al. |
| 2013/0329366 A1 | 12/2013 | Wang et al. |
| 2014/0037531 A1 | 2/2014 | Liu et al. |
| 2014/0050910 A1 | 2/2014 | Mukherjee et al. |
| 2014/0079932 A1 | 3/2014 | Aksay et al. |
| 2014/0120024 A1 | 5/2014 | Tour et al. |
| 2014/0124176 A1 | 5/2014 | Zhamu et al. |
| 2014/0127488 A1 | 5/2014 | Zhamu et al. |
| 2014/0147648 A1 | 5/2014 | Zhamu et al. |
| 2014/0154941 A1 | 6/2014 | Zhamu et al. |
| 2014/0170057 A1 | 6/2014 | Huang et al. |
| 2014/0190676 A1 | 7/2014 | Zhamu et al. |
| 2014/0209168 A1 | 7/2014 | Zhamu et al. |
| 2014/0224466 A1 | 8/2014 | Lin et al. |
| 2014/0228513 A1 | 8/2014 | Jeol et al. |
| 2014/0242275 A1 | 8/2014 | Zhamu et al. |
| 2015/0086881 A1 | 3/2015 | Zhamu et al. |

(56) References Cited

U.S. PATENT DOCUMENTS

2015/0266739 A1 9/2015 Zhamu et al.
2015/0284253 A1 10/2015 Zhamu et al.

FOREIGN PATENT DOCUMENTS

| JP | H10168502 A | 6/1998 |
|---|---|---|
| JP | 2008050228 A | 3/2008 |
| JP | 2011168449 A | 9/2011 |
| WO | 2012006657 A1 | 1/2012 |

OTHER PUBLICATIONS

U.S. Appl. No. 13/694,161 Response to nfOA dated Mar. 18, 2016, 20 pages.
U.S. Appl. No. 13/694,162 Advisory Action dated Dec. 15, 2015, 3 pages.
U.S. Appl. No. 13/694,162 Final Office Action dated Aug. 26, 2015, 18 pages.
U.S. Appl. No. 13/694,162 Final Office Action dated Feb. 7, 2017, 13 pages.
U.S. Appl. No. 13/694,162 Nonfinal Office Action dated Feb. 11, 2015, 14 pages.
U.S. Appl. No. 13/694,162 Nonfinal Office Action dated Jun. 29, 2016, 13 pages.
U.S. Appl. No. 13/694,162 Response to Final Office Action dated Jun. 26, 2017, 14 pages.
U.S. Appl. No. 13/694,162 Response to Final Office Action dated Nov. 24, 2015, 29 pages.
U.S. Appl. No. 13/694,162 Response to Nonfinal Office Action dated May 8, 2015, 23 pages.
U.S. Appl. No. 13/694,162 Response to Nonfinal Office Action dated Oct. 27, 2016, 15 pages.
U.S. Appl. No. 13/694,356 Final OA dated Apr. 30, 2015, 11 pages.
U.S. Appl. No. 13/694,356 Final OA dated Jan. 10, 2014, 11 pages.
U.S. Appl. No. 13/694,356 Final OA dated Jun. 13, 2016, 4 pages.
U.S. Appl. No. 13/694,356 Nonfinal OA dated Aug. 12, 2013, 9 pages.
U.S. Appl. No. 13/694,356 Nonfinal OA dated Jul. 26, 2016, 10 pages.
U.S. Appl. No. 13/694,356 Nonfinal OA dated Sep. 25, 2015, 13 pages.
U.S. Appl. No. 13/694,356 Nonfinal OA dated Sep. 30, 2014, 12 pages.
U.S. Appl. No. 13/694,356 Resp Adv Act dated May 5, 2014, 28 pages.
U.S. Appl. No. 13/694,356 Resp Final OA dated Apr. 7, 2014, 27 pages.
U.S. Appl. No. 13/694,356 Resp Final OA dated Jul. 30, 2015, 24 pages.
U.S. Appl. No. 13/694,356 Resp Final OA dated Jun. 14, 2016, 7 pages.
U.S. Appl. No. 13/694,356 Resp Nonfinal OA dated Dec. 22, 2014, 31 pages.
U.S. Appl. No. 13/694,356 Resp Nonfinal OA dated Feb. 5, 2016, 16 pages.
U.S. Appl. No. 13/694,356 Resp Nonfinal OA dated Oct. 18, 2013, 18 pages.
U.S. Appl. No. 13/694,356 Resp Nonfinal OA dated Sep. 12, 2016, 7 pages.
U.S. Appl. No. 13/694,356 Advisory Action dated Apr. 28, 2014, 4 pages.
U.S. Appl. No. 13/694,468 Resp nfOA dated May 13, 2015, 17 pages.
U.S. Appl. No. 13/694,468 fOA dated Jul. 13, 2015, 8 pages.
U.S. Appl. No. 13/694,468 nfOA dated Feb. 23, 2015, 13 pages.
U.S. Appl. No. 13/694,468 Resp fOA dated Jul. 29, 2015, 14 pages.
U.S. Appl. No. 13/694,722 Final Office Action dated Jun. 2, 2017, 14 pages.
U.S. Appl. No. 13/694,722 Final Office Action dated Nov. 17, 2015, 12 pages.
U.S. Appl. No. 13/694,722 Nonfinal Office Action dated Apr. 22, 2015, 9 pages.
U.S. Appl. No. 13/694,722 Nonfinal Office Action dated Oct. 7, 2016, 9 pages.
U.S. Appl. No. 13/694,722 Response to Final Office Action dated Feb. 17, 2016, 12 pages.
U.S. Appl. No. 13/694,722 Response to Final Office Action dated Sep. 22, 2017, 12 pages.
U.S. Appl. No. 13/694,722 Response to Nonfinal Office Action dated Feb. 1, 2017, 13 pages.
U.S. Appl. No. 13/694,722 Response to Nonfinal Office Action dated Jul. 27, 2015, 10 pages.
U.S. Appl. No. 13/694,791 Final Office Action dated Jun. 3, 2016, 17 pages.
U.S. Appl. No. 13/694,791 Nonfinal Office Action dated Nov. 9, 2015, 15 pages.
U.S. Appl. No. 13/694,791 Response Final Office Action dated Oct. 26, 2016, 21 pages.
U.S. Appl. No. 13/694,791 Response Nonfinal Office Action dated Feb. 16, 2016, 19 pages.
U.S. Appl. No. 13/815,100 final Office Action dated Nov. 3, 2016, 34 pages.
U.S. Appl. No. 13/815,100 nonfinal Office Action dated Mar. 13, 2017, 25 pages.
U.S. Appl. No. 13/815,100 Nonfinal Office Action dated Mar. 24, 2016, 29 pages.
U.S. Appl. No. 13/815,100 Response final Office Action dated Feb. 1, 2017, 28 pages.
U.S. Appl. No. 13/815,100 Response nonfinal Office Action dated Jul. 18, 2016, 16 pages.
U.S. Appl. No. 13/815,100 Response nonfinal Office Action dated Jun. 29, 2017, 14 pages.
U.S. Appl. No. 13/815,246 final Office Action dated Dec. 28, 2016, 9 pages.
U.S. Appl. No. 13/815,246 final Office Action dated Jun. 16, 2017, 6 pages.
U.S. Appl. No. 13/815,246 nonfinal Office Action dated Apr. 28, 2016, 12 pages.
U.S. Appl. No. 13/815,246 nonfinal Office Action dated Nov. 22, 2017, 6 pages.
U.S. Appl. No. 13/815,246 Response final Office Action dated Apr. 19, 2017, 12 pages.
U.S. Appl. No. 13/815,246 Response final Office Action dated Aug. 3, 2015, 2 pages.
U.S. Appl. No. 13/815,246 Response final Office Action dated Sep. 13, 2017, 12 pages.
U.S. Appl. No. 13/815,246 Response final Office Action dated Sep. 25, 2017, 16 pages.
U.S. Appl. No. 13/815,246 Response nonfinal Office Action dated Oct. 13, 2016, 12 pages.
U.S. Appl. No. 13/815,246 Response nonfinal Office Action dated Oct. 30, 2017, 4 pages.
Wang et al., "Transparent, Conductive Graphene Electrodes for Dye-Sensitized Solar Cells" Nano Letters (2008) vol. 8, pp. 323-327.
Worsley et al., "Synthesis of Graphene Aerogel with High Electrical Conductivity" Journal of the American Chemical Society (2010) vol. 132, No. 40, pp. 14067-14069.
Xu et al., "Self-Assembled Graphene Hydrogel via a One-Step Hydrothermal Process" ACS Nano (2010) vol. 4, No. 7, pp. 4324-4330.
Yu et al., "Significant thermal conductivity enhancement in graphene oxide papers modified with alkaline earth" Appl. Phys. Lett. (2013) vol. 103, p. 141913.
Zhang et al., "Mechanically strong and highly conductive graphene aerogel and its use as electrodes for electrochemical power sources" J. Mater. Chem. (2011) vol. 21, pp. 6494-6497.
Anderson et al., "The Use of Esters of N-Hydroxysuccinimide in Peptide Synthesis" J. Amer. Chem. Soc. (1964) vol. 86, No. 9, pp. 1839-1842.

(56) References Cited

OTHER PUBLICATIONS

Bucknall et al. "Relationship between Structure and Mechanical Properties in Rubber-Toughened Epoxy Resins" The British Polymer Journal (1978) vol. 10, pp. 53-59.
DE-202005001198 English Translation, 5 pages.
DE-3918140 English Translation, 5 pages.
Donald et al., "Internal structure of rubber particles and craze break-down in high-impact polystyrene" Journal of Materials Science (1982) vol. 17, pp. 2351-2358.
Hou et al., "Flexible Graphene-Graphene Composites of Superior Thermal and Electrical Transport Properties" ACS Appl. Mater. Interfaces (2014) vol. 6, pp. 15026-15032.
JP-2015-544155 Office Action dated Sep. 13, 2017, 4 pages.
Reina et al., "Large Area, Few-Layer Graphene Films on Arbitrary Substrates by Chemical Vapor Deposition" Nano Letters (2009) vol. 9, pp. 30-35.
U.S. Appl. No. 15/711,477 Nonfinal Office Action dated Sep. 3, 2019, 13 pages.
U.S. Appl. No. 13/815,100 Final Office Action dated Jan. 11, 2018, 25 pages.
U.S. Appl. No. 13/815,100 Nonfinal Office Action dated Mar. 21, 2019, 25 pages.
U.S. Appl. No. 15/711,477 Final Office Action dated Mar. 2, 2020, 7 pages.
U.S. Appl. No. 15/789,580 Nonfinal Office Action dated Jun. 25, 2019, 7 pages.
U.S. Appl. No. 15/862,199 Nonfinal Office Action dated Dec. 12, 2019, 13 pages.
U.S. Appl. No. 15/915,892 Final Office Action dated Mar. 24, 2020, 7 pages.
U.S. Appl. No. 15/915,892 Nonfinal Office Action dated Nov. 7, 2019, 6 pages.
Andrews et al., "Purification and structural annealing of multiwalled carbon nanotubes at graphitization temperatures" Carbon (2001) vol. 39, No. 11, pp. 1681-1687.
Angstron, "High Quality Graphene Oxide Product" Nov. 2010 (via Wayback Machine).
Bai et al., "On the Gelation of Graphene Oxide" Journal of Physical Chemistry (2011) vol. 115, pp. 5545-5551.
Balandin et al., "Superior Thermal Conductivity of Single-Layer Graphene" Nano Letters (2008) vol. 8, No. 3, pp. 902-907.
Batzill, "The Surface Science of Graphene: Metal Interfaces, CVD Synthesis, Nanoribbons, Chemical Modifications, and Defects" Surf. Sci. Rep. (2012) vol. 67, pp. 83-115.
Compton et al., Graphene Oxide, Highly Reduced Graphene Oxide, and Graphene: Versatile Building Blocks for Carbon-Based Materials (2010) vol. 6, No. 6, pp. 711-723.
Dreyer et al., "The chemistry of graphene oxide" Chem. Soc. Rev. (2010) vol. 39, pp. 228-240.
Duereh et al., "Replacement of hazardous chemicals used in engineering plastics with safe and renewable hydrogen-bond donor and acceptor solvent-pair mixtures" ACS Sustainable Chemistry & Engineering (2015) vol. 3.8, pp. 1881-1889.
Duereh et al., Supporting Information—Solvents—"Replacement of hazardous chemicals used in engineering plastics with safe and renewable hydrogen-bond donor and acceptor solvent-pair mixtures" ACS Sustainable Chemistry & Engineering (2015) vol. 3.8, pp. 1881-1889.
Duereh et al., Supporting Information—Solvents Supplement—"Replacement of hazardous chemicals used in engineering plastics with safe and renewable hydrogen-bond donor and acceptor solvent-pair mixtures" ACS Sustainable Chemistry & Engineering (2015) vol. 3.8, pp. 1881-1889.
Edwards et al., "Graphene Film Growth on Polycrystalline Metals" Accounts of Chem. Res. (2012).
Ghosh et al., "Dimensional crossover of thermal transport in few-layer graphene" Nature Materials (2010) vol. 9, pp. 555-558.
Gong et al., "Graphitization of Graphene Oxide with Ethanol during Thermal Reduction" J. Chem. Phys. C (2012) vol. 116, pp. 9969-9979.
Gyorki, "How to Select a Suitable Heat Sink" Design World (2009) pp. 1-5.
JP-2015-544155 Amendment to Response to Office action in Japanese.
JP-2015-544155 Argument to Response to Office action in Japanese.
Jung, "Tunable Electrical Conductivity of Individual Graphene Oxide Sheets Reduced at "Low" Temperatures" American Chemical Society Nano Letters (2008) vol. 8, No. 12, pp. 4283-4287.
Kidambi et al., "The Parameter Space of Graphene Chemical Vapor Deposition on Polycrystalline Cu" The Journal of Physical Chemistry (2012) vol. 116, No. 42, pp. 22492-22501.
Li et al., "Evolution of Graphene Growth on Ni and Cu by Carbon Isotope Labeling" Nano Letters (2009) vol. 9, pp. 4268-4272.
Mahanta et al., "Thermal Conductivity of Graphene and Graphene Oxide Nanoplatelets" IEEE, from 13th IEEE ITHERM Conference, Conference Date of May 30-Jun. 1, 2012, pp. 1-6.
Matsutani et al., "Low Temperature Curing of Polyimide Precursors by Variable Frequency Microwave" J. Photopolymer Science and Technology (2005) vol. 18, No. 2, pp. 327-332.
Mochida et al., "Catalysts in syntheses of carbon and carbon precursors" Journal of the Brazilian Chemical Society (2006) vol. 17, No. 6, pp. 1059-1037.
Muratoglu et al., "Toughening mechanism of rubber-modified polyamides" Polymer (1995) vol. 36, No. 5, pp. 921-930.
PCT/US13/71469 International Search Report dated Mar. 27, 2014, 3 pages.
Pei et al., "The reduction of graphene oxide" Carbon (2012) vol. 50, pp. 3210-3228.
Pop et al., "Thermal properties of graphene: Fundamentals and applications" MRS Bulletin (2012) vol. 37, pp. 1273-1281.
Seol et al., "Two-Dimensional Phonon Transport in Supported Graphene" Science (2010) vol. 328, No. 5975, pp. 213-216.
Tsen et al., "Tailoring Electrical Transport Across Grain Boundaries in Polycrystalline Graphene" Science (2012) vol. 336, pp. 1143-1146.
U.S. Appl. No. 13/385,813 Advisory Action dated Sep. 9, 2016, 8 pages.
U.S. Appl. No. 13/385,813 Final Office Action dated Apr. 22, 2016, 18 pages.
U.S. Appl. No. 13/385,813 Nonfinal Office Action dated Oct. 21, 2015, 14 pages.
U.S. Appl. No. 13/385,813 Response to Final Office dated Apr. 22, 2016, 31 pages.
U.S. Appl. No. 13/385,813 Response to Nonfinal Office Action, 37 pages.
U.S. Appl. No. 13/506,265 Final Office Action dated Nov. 28, 2014, 10 pages.
U.S. Appl. No. 13/506,265 Nonfinal Office Action dated Aug. 14, 2014, 9 pages.
U.S. Appl. No. 13/506,265 Nonfinal Office Action dated Aug. 25, 2015, 8 pages.
U.S. Appl. No. 13/506,265 Nonfinal Office Action dated Mar. 17, 2015, 10 pages.
U.S. Appl. No. 13/506,265 Response to Final Office Action filed Feb. 19, 2015, 23 pages.
U.S. Appl. No. 13/506,265 Response to Nonfinal Office Action dated Dec. 10, 2015, 7 pages.
U.S. Appl. No. 13/506,265 Response to Nonfinal Office Action dated Jun. 22, 2015, 18 pages.
U.S. Appl. No. 13/506,265 Response to Nonfinal Office Action dated Oct. 14, 2014, 16 pages.
U.S. Appl. No. 13/507,167 Final Office Action dated Jan. 21, 2016, 30 pages.
U.S. Appl. No. 13/507,167 Nonfinal Office Action dated Aug. 25, 2015, 14 pages.
U.S. Appl. No. 13/507,167 Response to Final Office Action dated Mar. 21, 2016, 30 pages.
U.S. Appl. No. 13/507,167 Response to Nonfinal Office Action dated Nov. 23, 2015, 34 pages.
U.S. Appl. No. 13/694,161 Advisory Action dated Dec. 9, 2016, 6 pages.
U.S. Appl. No. 13/694,161 fOA dated Jun. 17, 2016, 37 pages.

(56) References Cited

OTHER PUBLICATIONS

U.S. Appl. No. 13/694,161 nfOA dated Dec. 9, 2015, 33 pages.
U.S. Appl. No. 13/694,161 nfOA dated May 17, 2017, 28 pages.
U.S. Appl. No. 13/694,161 Response to fOA dated Nov. 2, 2016, 37 pages.

* cited by examiner

20 μm

PROCESS FOR NANO GRAPHENE PLATELET-REINFORCED COMPOSITE MATERIAL

CROSS REFERENCE TO RELATED APPLICATIONS

The present application is a continuation of U.S. patent application Ser. No. 13/815,246, filed Feb. 14, 2013, which is hereby incorporated by reference for all purposes.

FIELD OF THE INVENTION

The present invention relates generally to the field of composite materials for heat dissipation applications and, more particularly, to a finned heat sink formed of a graphene platelet-reinforced composite. This composite exhibits a combination of an exceptionally high thermal conductivity and structural integrity not achievable with the conventional carbon nanofiber-, carbon nanotube-, graphite particle-, carbon black-resin composites, flexible graphite sheet, and resin-impregnated flexible graphite composites.

BACKGROUND OF THE INVENTION

Advanced thermal management materials are becoming critical for today's microelectronic, photonic, and photovoltaic systems. For instance, as new and more powerful chip designs and light-emitting diode (LED) systems are introduced, they consume more power and generate more heat. This has made thermal management a crucial issue in today's high performance systems. Systems ranging from active electronically scanned radar arrays, web servers, large battery packs for consumer electronics, wide-screen displays, and solid-state lighting devices all require high thermal conductivity materials that can dissipate heat more efficiently. On the other hand, the devices are designed and fabricated to become increasingly smaller, thinner, lighter, and tighter. This further increases the difficulty of thermal dissipation. Actually, thermal management challenges are now widely recognized as the key barriers to industry's ability to provide continued improvements in device and system performance.

Heat sinks are components that facilitate heat dissipation from the surface of a heat source, such as a CPU or battery in a computing device or a LED (low-power or high-power), to a cooler environment, such as ambient air. Typically, heat transfer between a solid surface and the air is the least efficient within the system, and the solid-air interface thus represents the greatest barrier for heat dissipation. A heat sink is designed to enhance the heat transfer efficiency between a heat source and the air mainly through enhanced thermal conductivity and increased heat sink surface area that is in direct contact with the air. This design enables a faster heat dissipation rate and thus lowers the device operating temperature.

Heat sinks are usually made from a metal, especially copper or aluminum, due to the ability of metal to readily transfer heat across its entire structure. Cu and Al heat sinks are formed with fins or other structures to increase the surface area of the heat sink, often with air being forced across or through the fins to facilitate heat dissipation of heat to the air. However, there are several major drawbacks or limitations associated with the use of metallic heat sinks:

(1) One drawback relates to the relatively low thermal conductivity of a metal (the best being 400 W/mK for Cu and 80-200 W/mK for Al alloy).

(2) In addition, the use of copper or aluminum heat sinks can present a problem because of the weight of the metal, particularly when the heating area is significantly smaller than that of the heat sink. For instance, pure copper weighs 8.96 grams per cubic centimeter ($g/cm^3$) and pure aluminum weighs 2.70 $g/cm^3$. In many applications, an array of several heat sinks is needed on a circuit board to dissipate heat from a variety of components on the board. If metallic heat sinks are employed, the sheer weight of the metal on the board can increase the chances of the board cracking or of other undesirable effects, and increase the weight of the component itself.

(3) Many metals do not exhibit a high surface thermal emissivity and thus do not effectively dissipate heat through the radiation mechanism.

(4) For outdoor applications (e.g. LED-based street lights), metals have severe corrosion issues.

Thus, there is a strong need for a non-metallic heat sink system effective for dissipating heat produced by a heat source such as a LED. The heat sink system should exhibit a higher thermal conductivity and/or a higher thermal conductivity-to-weight ratio as compared to metallic heat sinks. These heat sinks must also be mass-producible, preferably using a cost-effective process. This processing ease requirement is important since metallic heat sinks can be readily produced in large quantities using scalable techniques such as extrusion, stamping, and die casting. Any economically viable alternative to metallic heat sinks also has to be mass-producible in order to stay competitive.

One group of materials potentially suitable for heat sink applications is the graphitic carbon or graphite. Carbon is known to have five unique crystalline structures, including diamond, fullerene (0-D nanographitic material), carbon nanotube or carbon nanofiber (1-D nanographitic material), graphene (2-D nanographitic material), and graphite (3-D graphitic material). The carbon nanotube (CNT) refers to a tubular structure grown with a single wall or multi-wall. Carbon nanotubes (CNTs) and carbon nanofibers (CNFs) have a diameter on the order of a few nanometers to a few hundred nanometers. Their longitudinal, hollow structures impart unique mechanical, electrical and chemical properties to the material. The CNT or CNF is a one-dimensional nanocarbon or 1-D nanographite material.

Bulk natural flake graphite is a 3-D graphitic material with each particle being composed of multiple grains (a grain being a graphite single crystal or crystallite) with grain boundaries (amorphous or defect zones) demarcating neighboring graphite single crystals. Each grain is composed of multiple graphene planes that are oriented parallel to one another. A graphene plane in a graphite crystallite is composed of carbon atoms occupying a two-dimensional, hexagonal lattice. In a given grain or single crystal, the graphene planes are stacked and bonded via van der Waal forces in the crystallographic c-direction (perpendicular to the graphene plane or basal plane). Although all the graphene planes in one grain are parallel to one another, typically the graphene planes in one grain and the graphene planes in an adjacent grain are different in orientation. In other words, the orientations of the various grains in a graphite particle typically differ from one grain to another.

A graphite single crystal (crystallite) per se is anisotropic with a property measured along a direction in the basal plane (crystallographic a- or b-axis direction) being dramatically different than if measured along the crystallographic c-axis direction (thickness direction). For instance, the thermal conductivity of a graphite single crystal can be up to approximately 1,920 W/mK (theoretical) or 1,800 W/mK (experimental) in the basal plane (crystallographic a- and b-axis directions), but that along the crystallographic c-axis direction is less than 10 W/mK (typically less than 5 W/mK). Consequently, a natural graphite particle composed of multiple grains of different orientations exhibits an average property between these two extremes.

The constituent graphene planes of a graphite crystallite can be exfoliated and extracted or isolated from a graphite crystallite to obtain individual graphene sheets of carbon atoms provided the inter-planar van der Waals forces can be overcome. An isolated, individual graphene sheet of carbon atoms is commonly referred to as single-layer graphene. A stack of multiple graphene planes bonded through van der Waals forces in the thickness direction with an inter-graphene plane spacing of 0.3354 nm is commonly referred to as a multi-layer graphene. A multi-layer graphene platelet has up to 300 layers of graphene planes (<100 nm in thickness), but more typically up to 30 graphene planes (<10 nm in thickness), even more typically up to 20 graphene planes (<7 nm in thickness), and most typically up to 10 graphene planes (commonly referred to as few-layer graphene in scientific community). Single-layer graphene and multi-layer graphene sheets are collectively called "nanographene platelets" (NGPs). Graphene sheets/platelets or NGPs are a new class of carbon nanomaterial (a 2-D nanocarbon) that is distinct from the 0-D fullerene, the 1-D CNT, and the 3-D graphite.

Our research group pioneered the development of graphene materials and related production processes as early as 2002: (1) B. Z. Jang and W. C. Huang, "Nano-scaled Graphene Plates," U.S. Pat. No. 7,071,258 (Jul. 4, 2006), application submitted in October 2012; (2) B. Z. Jang, et al. "Process for Producing Nano-scaled Graphene Plates," U.S. patent application Ser. No. 10/858,814 (Jun. 3, 2004) (U.S. Patent Pub. No. 2005/0271574); and (3) B. Z. Jang, A. Zhamu, and J. Guo, "Process for Producing Nano-scaled Platelets and Nanocomposites," U.S. patent application Ser. No. 11/509,424 (Aug. 25, 2006) (U.S. Patent Pub. No. 2008-0048152).

NGPs are typically obtained by intercalating natural graphite particles with a strong acid and/or oxidizing agent to obtain a graphite intercalation compound (GIC) or graphite oxide (GO), as illustrated in FIG. 1(a) (process flow chart) and FIG. 1(b) (schematic drawing). The presence of chemical species or functional groups in the interstitial spaces between graphene planes serves to increase the inter-graphene spacing ($d_{002}$, as determined by X-ray diffraction), thereby significantly reducing the van der Waals forces that otherwise hold graphene planes together along the c-axis direction. The GIC or GO is most often produced by immersing natural graphite powder (20 in FIGS. 1(a) and 100 in FIG. 1(b)) in a mixture of sulfuric acid, nitric acid (an oxidizing agent), and another oxidizing agent (e.g. potassium permanganate or sodium perchlorate). The resulting GIC (22 or 102) is actually some type of graphite oxide (GO) particles. This GIC is then repeatedly washed and rinsed in water to remove excess acids, resulting in a graphite oxide suspension or dispersion, which contains discrete and visually discernible graphite oxide particles dispersed in water. There are two processing routes to follow after this rinsing step:

Route 1 involves removing water from the suspension to obtain "expandable graphite," which is essentially a mass of dried GIC or dried graphite oxide particles. Upon exposure of expandable graphite to a temperature in the range from typically 800-1,050° C. for approximately 30 seconds to 2 minutes, the GIC undergoes a rapid expansion by a factor of 30-300 to form "graphite worms" (24 or 104), which are each a collection of exfoliated, but largely un-separated graphite flakes that remain interconnected. A SEM image of graphite worms is presented in FIG. 2(a).

In Route 1A, these graphite worms (exfoliated graphite or "networks of interconnected/non-separated graphite flakes") can be re-compressed to obtain flexible graphite sheets or foils (26 or 106) that typically have a thickness in the range from 0.1 mm (100 µm)-0.5 mm (500 µm). Alternatively, one may choose to use a low-intensity air mill or shearing machine to simply break up the graphite worms for the purpose of producing the so-called "expanded graphite flakes" (49 or 108) which contain mostly graphite flakes or platelets thicker than 100 nm (hence, not a nanomaterial by definition).

Exfoliated graphite worms, expanded graphite flakes, and the recompressed mass of graphite worms (commonly referred to as flexible graphite sheet or flexible graphite foil) are all 3-D graphitic materials that are fundamentally different and patently distinct from either the 1-D nanocarbon material (CNT or CNF) or the 2-D nanocarbon material (graphene sheets or platelets, NGPs). Flexible graphite (FG) foils can be used as a heat spreader material, but exhibiting a maximum in-plane thermal conductivity of typically less than 500 W/mK (more typically <300 W/mK) and in-plane electrical conductivity no greater than 1,500 S/cm. These low conductivity values are a direct result of the many defects, wrinkled or folded graphite flakes, interruptions or gaps between graphite flakes, and non-parallel flakes (e.g. SEM image in FIG. 2(b)). Many flakes are inclined with respect to one another at a very large angle (e.g. misorientation of 20-40 degrees). The mechanical properties (tensile strength, flexural strength, and moduli) of flexible graphite and resin-impregnated flexible graphite are relatively poor.

In Route 1B, the exfoliated graphite is subjected to high-intensity mechanical shearing (e.g. using an ultrasonicator, high-shear mixer, high-intensity air jet mill, or high-energy ball mill) to form separated single-layer and multi-layer graphene sheets (collectively called NGPs, 33 or 112), as disclosed in our U.S. application Ser. No. 10/858,814. Single-layer graphene can be as thin as 0.34 nm, while multi-layer graphene can have a thickness up to 100 nm. In the present application, the thickness of multi-layer NGPs is typically less than 20 nm.

Route 2 entails ultrasonicating the graphite oxide suspension for the purpose of separating/isolating individual graphene oxide sheets from graphite oxide particles. This is based on the notion that the inter-graphene plane separation has been increased from 0.3354 nm in natural graphite to 0.6-1.1 nm in highly oxidized graphite oxide, significantly weakening the van der Waals forces that hold neighboring planes together. Ultrasonic power can be sufficient to further separate graphene plane sheets to form separated, isolated, or discrete graphene oxide (GO) sheets. These graphene oxide sheets can then be chemically or thermally reduced to obtain "reduced graphene oxides" (RGO) typically having an oxygen content of 0.001%-10% by weight, more typically 0.01%-5% by weight, and most typically 0.01%-2% by weight.

For the purpose of defining the claims of the instant application, NGPs include discrete sheets/platelets of single-layer and multi-layer graphene, graphene oxide, or reduced graphene oxide. Pristine graphene has essentially 0% oxygen. Graphene oxide (including RGO) can have 0.001%-46% by weight of oxygen.

It may be noted that flexible graphite foils (obtained by compressing or roll-pressing exfoliated graphite worms) for electronic device thermal management applications (e.g. as a heat sink material) have the following major deficiencies:

(1) As indicated earlier, flexible graphite (FG) foils exhibit a relatively low thermal conductivity, typically <500 W/mK and more typically <300 W/mK. By impregnating the exfoliated graphite with a resin, the resulting composite exhibits an even lower thermal conductivity (typically <<200 W/mK, more typically <100 W/mK).

(2) Flexible graphite foils are of low strength, low rigidity, and poor structural integrity. The high tendency for flexible graphite foils to get torn apart makes them difficult to handle in the process of making a heat sink. As a matter of fact, the flexible graphite sheets (typically 50-200 µm thick) are so "flexible" that they are not sufficiently rigid to make a fin component material for a finned heat sink.

(3) Flexible graphite sheets are not geometrically or structurally amenable to impregnation of resin into the sheet-like structure. Even after puncturing the flexible graphite sheet with glass fibers, for instance, to create resin entry channels, there is a limited amount of resin that can be impregnated into the sheet, resulting in poor structural strength. Quite surprisingly, mixing of graphite worms with a resin prior to roll-pressing leads to poor structural strength as well even though the resulting composite can contain a large proportion of resin.

(4) Another very subtle, largely ignored or overlooked, but critically important feature of FG foils is their high tendency to get flaky with graphite flakes easily coming off from FG sheet surfaces and emitting out to other parts of a microelectronic device. These highly electrically conducting flakes (typically 1-200 µm in lateral dimensions and >100 nm in thickness) can cause internal shorting and failure of electronic devices.

(5) Both resin-free flexible graphite and resin-impregnated FG (with resin impregnating step occurring before or after roll-pressing) are not conducive to mass production of finned heat sink structures. It is virtually impossible to use mass production processes (such as extrusion, stamping, forging, and die casting that are commonly used for making aluminum heat sinks, or injection molding for making conductive filler-reinforced plastic-based heat sinks) to make FG-based heat sinks without some kind of subsequent bonding or assembling operations. One has to manually attach individual fin members to a core or base member. For instance, one may produce bonded fin heat sink assemblies in which each fin in the assembly is individually bonded into a heat sink base. A major shortcoming of such heat sinks is their high cost. This cost is related directly to the labor required to individually arrange each fin on some sort of support or substrate (a base or core) and high production cycle time. Further, bonding between a fin and a base is not always reliable and the long-term reliability of flexible graphite-based finned heat sinks is highly questionable. Flexible graphite based heat sinks (essentially all of them having resin impregnation or resin coating) are disclosed in the following patents: J. Norley, et al., "Graphite-based heat sinks," U.S. Pat. No. 6,503,626 (Jan. 7, 2003); M. D. Smalc, et al., "Radial finned heat sink," U.S. Pat. No. 6,538,892 (Mar. 25, 2003); G. Getz, et al., "Heat sinks made from longer and shorter graphite sheets," U.S. Pat. No. 6,771,502 (Aug. 3, 2004).

Similarly, solid NGPs (including discrete sheets/platelets of pristine graphene, GO, and GRO), when packed into a film, membrane, or paper sheet (34 or 114) of non-woven aggregates, typically do not exhibit a high thermal conductivity unless these sheets/platelets are closely packed and the film/membrane/paper is ultra-thin (e.g. <1 µm, which is mechanically weak). This is reported in our earlier U.S. patent application Ser. No. 11/784,606 (Apr. 9, 2007) (now U.S. Pat. Pub. No. 2008-0248275). However, ultra-thin film or paper sheets (<10 µm) are difficult to produce in mass quantities, and difficult to handle when one tries to incorporate these thin films as a heat sink material. In general, a paper-like structure or mat made from platelets of graphene, GO, or RGO (e.g. those paper sheets prepared by vacuum-assisted filtration process) exhibit many defects, wrinkled or folded graphene sheets, interruptions or gaps between platelets, and non-parallel platelets (e.g. SEM image in FIG. 3(b)), leading to relatively poor thermal conductivity, low electric conductivity, and low structural strength. These papers or aggregates of discrete NGP, GO or RGO platelets alone (without a resin binder) also have a tendency to get flaky, emitting conductive particles into air. Our earlier application (U.S. application Ser. No. 11/784,606 now U.S. Pat. Pub. No. 2008-0248275) also disclosed a mat, film, or paper of NGPs infiltrated with a metal, glass, ceramic, resin, and CVD carbon matrix material. However, there was no teaching of using these infiltrated NGPs as a finned heat sink. NGP-reinforced polymers have been known to exhibit very poor flow behavior when the NGP amount is higher than 15-20% by weight. It has been commonly believed in the composite material community that composite materials with a higher nanomaterial filler loading than 15-20% could not be molded into thin components with a thickness less than 1 or 2 mm. Hence, it would not be considered feasible to produce NGP composite heat sinks having a fin thinner than 2 mm.

Haddon, et al. (U.S. Publication No. 2010/0140792, Jun. 10, 2010) also reported NGP thin film and NGP-reinforced polymer matrix composites for thermal management applications. The processes used by Haddon et al to produce NGPs are identical to those disclosed much earlier by us (Jang, et al. U.S. patent application Ser. No. 10/858,814 (Jun. 3, 2004)). The NGP-reinforced polymer matrix composites, as an intended thermal interface material, have very low thermal conductivity, typically <<2 W/mK. The NGP films of Haddon, et al are essentially non-woven aggregates of discrete graphene platelets, identical to those of our earlier invention (U.S. application Ser. No. 11/784,606 now U.S. Pat. Pub. No. 2008-0248275). Again, these aggregates have a great tendency to have graphite particles flaking and separated from the film surface, creating internal shorting problem for the electronic device containing these aggregates. They also exhibit low thermal conductivity unless made into thin films (10 nm-300 nm, as reported by Haddon, et al) which are very difficult to handle in a real device manufacturing environment. Balandin, et al (U.S. Pub. No. 2010/0085713, Apr. 8, 2010) also disclosed a graphene layer produced by CVD deposition or diamond conversion for heat spreader application. More recently, Kim, et al (N. P. Kim and J. P. Huang, "Graphene Nanoplatelet Metal Matrix," U.S. Pub. No. 2011/0108978, May 10, 2011) reported metal matrix infiltrated NGPs. However, the metal matrix is too heavy and the resulting metal matrix composite does not exhibit a high thermal conductivity. More significantly, all these prior art materials and related processes are not amenable to mass production of finned heat sinks cost-effectively. In fact, there has been no known report on using these materials for finned heat sink applications.

Another prior art material for thermal management application is the pyrolitic graphite film. The lower portion of FIG. 1(a) illustrates a typical process for producing prior art pyrolitic graphitic films from a polymer. The process begins with carbonizing a polymer film 46 at a carbonization temperature of 400-1,000° C. under a typical pressure of 10-15 Kg/cm² for 2-10 hours to obtain a carbonized material 48, which is followed by a graphitization treatment at 2,500-3,200° C. under an ultrahigh pressure of 100-300 Kg/cm² for 1-24 hours to form a graphitic film 50. It is technically utmost challenging to maintain such an ultrahigh pressure at such an ultrahigh temperature. This is a difficult, slow, tedious, energy-intensive, and very expensive process. Furthermore, carbonization of certain polymers (e.g. polyacrylonitrile) involves the emission of toxic species.

A second type of pyrolytic graphite is produced by high temperature decomposition of hydrocarbon gases in vacuum followed by deposition of the carbon atoms to a substrate surface. This vapor phase condensation of cracked hydrocarbons is essentially a chemical vapor deposition (CVD) process. In particular, highly oriented pyrolitic graphite (HOPG) is the material produced by the application of uniaxial pressure on deposited pyrocarbon or pyrolytic graphite at very high temperatures (typically 3,000-3,300° C.). This entails a thermo-mechanical treatment of combined mechanical compression and ultra-high temperature for an extended period of time in a protective atmosphere; a very expensive, energy-intensive, and technically challenging process. The process requires ultra-high temperature equipment (with high vacuum, high pressure, or high compression provision) that is not only very expensive to make but also very expensive and difficult to maintain. Even with such extreme processing conditions, the resulting PG (including HOPG) still possesses many defects, grain boundaries, and mis-orientations (neighboring graphene planes not parallel to each other), resulting in less-than-satisfactory in-plane properties. Typically, the best prepared HOPG sheet or block remains far from being a graphite single crystal; instead, it typically still contains many grains or crystals and a vast amount of grain boundaries and defects. All PG film production processes do not allow for impregnation of a resin matrix. PG or HOPG films, being weak, non-rigid, and not easily processable suffer from the same shortcomings as flexible graphite intended for use to construct finned heat sinks. Furthermore, PG or HOPG films are extremely expensive.

Thus, it is an object of the present invention to provide a finned heat sink formed of nanographene platelet-reinforced composite that exhibits a thermal conductivity comparable to or greater than the thermal conductivity of the resin-impregnated FG, and a higher mechanical strength.

This thermally and electrically conductive graphene platelet composite can be used to produce finned heat sinks cost effectively in large quantities, using commonly used, less complex, and easier-to-control processes with readily available, inexpensive equipment.

It is another object of the present invention to provide an integral finned heat sink formed of a NGP-reinforced composite that exhibits a combination of exceptional thermal conductivity, electrical conductivity, mechanical strength, surface hardness, and scratch resistance. The fins and the base (or core) portion of the heat sink are formed into an integral body that does not involve attaching or bonding individual fin components to the base, or stacking and assembling individual fin sheets together (as would be required in assembling flexible graphite-based finned heat sinks).

It is a specific object of the present invention to provide a highly conductive NGP-reinforced composite heat sink that meets the following technical requirements (a) a thermal conductivity greater than 200 W/mK (preferably greater than 300 W/mK, and further preferably greater than 400 W/mK, or even greater than 1,000 W/mK); (b) an electrical conductivity greater than 1,000 S/cm (preferably >2,000 S/cm, more preferably >3,000 S/cm, even more desirably >5,000 S/cm, and most preferably >10,000 S/cm); (c) Rockwell surface hardness value >60 (preferably >80); and/or (d) a tensile or flexural strength greater than 60 MPa (preferably >100 MPa, more preferably >150 MPa, and most preferably >200 MPa). No prior art material meets this set of technical requirements.

The present invention also provides a method or process capable of cost-effectively mass-producing finned heat sinks from such a graphene platelet-reinforced composite.

SUMMARY OF THE INVENTION

The present invention provides an integrated heat sink comprising a graphene platelet-reinforced composite article that is shaped in such a manner that the article comprises a heat collection member (corresponding to a core or base member of a finned heat sink) and at least one heat dissipation member (e.g. a fin or multiple fins) integral to the heat collection member (base). The heat collection member is configured to be in thermal contact with a heat source (e.g. a LED of a lighting device, or a CPU of a computing device), collects heat from this heat source, and dissipates heat through the at least one heat dissipation member (e.g., dissipates the heat though the fins into the air). The graphene platelet-reinforced composite has graphene platelets or sheets as a first reinforcement phase dispersed in a matrix material and the first reinforcement phase occupies a weight fraction of 1-90% (preferably >20%, further preferably >25%) based on the total composite weight.

Preferably, the graphene platelets and sheets form a three-dimensional network of continuous electron-conducting or phonon-conducting paths. Further preferably, multiple graphene platelets and sheets are bonded together with a first adhesive material to form a three-dimensional network of continuous electron-conducting and phonon-conducting path prior to mixing or being impregnated with the matrix material. This 3-D network of NGPs may be in the form of a porous preform having pores to accommodate the matrix material or a precursor to the matrix material which, upon consolidation and/or solidification, becomes the integrated heat sink of excellent structural integrity. The adhesive helps to maintain the 3-D conducting pathway network during handling and processing of the preform and the composite.

The matrix material may be selected from a polymer, metal, ceramic, glass, carbonaceous, or graphitic material. The graphene platelets or sheets can contain single-layer graphene sheets or multi-layer graphene platelets having a thickness less than 10 nm.

The graphene platelet-reinforced composite may further contain a second discrete reinforcement phase dispersed in the matrix and the second reinforcement phase preferably contains a particle, filament, nanotube, nanowire, nanoplatelet, or nanorod of a metal, ceramic, glass, polymer, carbon, graphite, or a combination thereof. In particular, the composite further contains a second reinforcement phase of a solid carbon or graphite dispersed in the matrix material and the second reinforcement phase is selected from a carbon or graphite fiber, carbon or graphite nanofiber, carbon nanotube, carbon nanorod, mesophase carbon particle, mesocarbon microbead, expanded graphite flake with a thickness greater than 100 nm, exfoliated graphite or graphite worm, coke particle, needle coke, carbon black, acetylene black particle, activated carbon particle, or a combination thereof wherein said carbon or graphite phase occupies a weight fraction of 1% to 50% (preferably less than 10% if carbon nanofiber or carbon nanotube is involved) based on the total composite weight. When a second reinforcement phase is present, NGP content is preferably no less than 10% by weight and further preferably greater than 20% by weight.

In a presently invented integrated heat sink, the graphene platelet-reinforced composite has a thermal conductivity greater than 20 W/mK (preferably greater than 50 W/mK, more preferably greater than 100 W/mK, further preferably greater than 200 W/mK, even more preferably greater than 400 W/mK, and most preferably greater than 500 or 1,000 W/mK), and/or a tensile strength greater than 60 MPa (preferably greater than 100 MPa, more preferably greater than 200 MPa, and most preferably greater than 300 MPa). The presently invented NGP-reinforced composite also has a high surface scratch resistance and reduced/eliminated possibility of graphene platelets flaking off from the heat sink surface. No conventional composites possess such a combination of outstanding properties.

In one preferred embodiment, the at least one heat dissipation member comprises fins formed at a surface of the heat collection member.

One further preferred embodiment of the present invention is an integrated heat sink comprising a nanographene platelet-reinforced composite article shaped so as to provide a heat collection surface and at least one heat dissipation surface connected or integral to the heat collection surface, wherein the heat collection surface is configured to be in thermal contact with a heat source, collects heat from the heat source, and dissipates heat through the at least one heat dissipation surface, and further wherein the heat sink is formed of a graphene platelet-reinforced composite having nanographene platelets or sheets as a first reinforcement phase dispersed in a matrix material and the first reinforcement phase occupies a weight fraction of 1-90% (preferably >20%, further preferably >25%, and more preferably >30%) based on the total composite weight. The matrix material is selected from a polymer, a metal, a ceramic, a glass, a petroleum or coal tar pitch, a mesophase pitch, a polymeric carbon (carbonized polymer), an amorphous carbon, a CVD carbon, a graphite or graphitic material, or a combination thereof.

The integrated heat sink of the present invention contains at least one heat dissipation member (fin), preferably multiple fins that are formed at a surface of the heat collection member (core or base member). The fins and the base preferably constitute an integrated structure, but can be assembled from perhaps 2-4 sub-assemblies (but not involving assembling individual fins to the base). The integrated heat sink preferably has structural features comprising cavities therein, holes therethrough, or combinations of cavities therein and holes therethrough, and multiple heat dissipation members (fins) of the unitary graphene material article comprising members of the structural features.

The integrated heat sink is preferably a radial finned heat sink assembly that comprises: (a) a base comprising one heat collection surface (a surface of a base member or a surface constituted by the ends of multiple fins); and (b) a plurality of spaced parallel planar fin members supported by or integral with the base, wherein the planar fin members comprise the at least one heat dissipation member. The multiple parallel planar fin members preferably are equally spaced.

In another preferred embodiment, the integrated heat sink comprises a radial finned heat sink assembly that comprises: (a) a base comprising a heat collection surface; and (b) a plurality of spaced fin members supported by or integral with the base, wherein the fin members comprise the at least one heat dissipation member.

Preferably, each fin comprises a surface coated with a high-emissivity material having an emissivity greater than an emissivity of the unitary graphene material itself. The high-emissivity material may be selected from aluminum oxide, zinc oxide, aluminum nitride, titanium oxide, boron nitride, silicon carbide, silicon nitride, gallium nitride, or a combination thereof. The high-emissivity material may be in the form of metal or ceramic nanoparticles.

The present invention also provides an electronic device that comprises a heat sink as described above. The heat source may be an electronic component of a device. The heat source in the electronic device can be a CPU in a computing device, a LED device, a camera unit, a battery, a supercapacitor, or an electric power supply that generates heat when the device is in operation. A particularly useful application of the presently invented heat sink is a light-emitting diode (LED) system.

The present invention also provides a process of producing an integrated heat sink. The process comprises: (a) providing a plurality of nanographene platelets (NGPs); (b) assembling said NGPs into a porous preform; (c) mixing or impregnating the preform with a matrix material to form an impregnated preform; and (d) shaping and/or solidifying the impregnated preform to produce the integrated heat sink. Preferably, step (b) comprises bonding the NGPs with a first adhesive material to form a preform of structural integrity. Further preferably, step (b) comprises assembling the NGPs and a flowable or meltable adhesive to form a porous preform and activating the adhesive to bond the NGPs together to obtain a preform of structural integrity. The flowable or meltable adhesive may be in the form of thermoplastic fibers or particles that are initially co-mixed with NGPs (along with optional second reinforcement phase particles/fibers) to form a preform shape. The activating operation may, for instance, include heating and melting thermoplastic fibers, allowing the polymer melt to bond NGP together at certain points of contact, followed by solidifying the thermoplastic.

Also preferably, step (a) includes further providing a second discrete reinforcement phase selected from a particle, filament, nanotube, nanowire, or nanorod of a metal, ceramic, glass, polymer, carbon, graphite, or a combination thereof and step (b) includes assembling the NGPs and the second reinforcement phase into a porous preform. In particular, second reinforcement phase is advantageously selected from a carbon or graphite fiber, carbon or graphite nanofiber, carbon nanotube, carbon nanorod, mesophase carbon particle, mesocarbon microbead, expanded graphite flake with a thickness greater than 100 nm, exfoliated graphite or graphite worm, coke particle, needle coke, carbon black, acetylene black particle, activated carbon particle, or a combination thereof; wherein the carbon or graphite phase occupies a weight fraction of 1% to 50% based on the total composite weight.

Another embodiment of the present invention is a process of producing the integrated heat sink. The process comprises (a) providing a plurality of nanographene platelets (NGPs); (b) mixing the NGPs with a matrix material or its precursor to form a shapeable mixture; (c) using a molding tool to form the shapeable mixture into a desired shape wherein the NGPs form a three-dimensional network of electron- and phonon-conducting paths; and (d) curing or solidifying the mixture of a desired shape to produce the integrated heat sink. Preferably, step (a) includes further providing a second discrete reinforcement phase selected from a particle, filament, nanotube, nanowire, or nanorod of a metal, ceramic, glass, polymer, carbon, graphite, or a combination thereof and step (b) includes mixing the NGPs and the second reinforcement phase with a matrix material or its precursor to form a shapeable mixture. Advantageously, the second reinforcement phase is selected from a carbon or graphite fiber, carbon or graphite nanofiber, carbon nanotube, carbon nanorod, mesophase carbon particle, mesocarbon microbead, expanded graphite flake with a thickness greater than 100 nm, exfoliated graphite or graphite worm, coke particle, needle coke, carbon black, acetylene black particle, activated carbon particle, or a combination thereof, wherein the carbon or graphite phase occupies a weight fraction of 1% to 50% based on the total composite weight.

DESCRIPTION OF THE PREFERRED EMBODIMENTS

In a preferred embodiment of the present invention, the nanographene platelet-reinforced integrated heat sink comprises a heat collection member (core or base) and at least one heat dissipation member (e.g. a fin or multiple fins) integral to the heat collection member (base) to form a finned heat sink. The fins and the core are naturally connected or integrated together into a unified body without using an externally applied adhesive or mechanical fastening means to connect the fins to the core. The heat collection base has a surface in thermal contact with a heat source (e.g. a LED), collects heat from this heat source, and dissipates heat through the fins into the air.

Figure 1A:
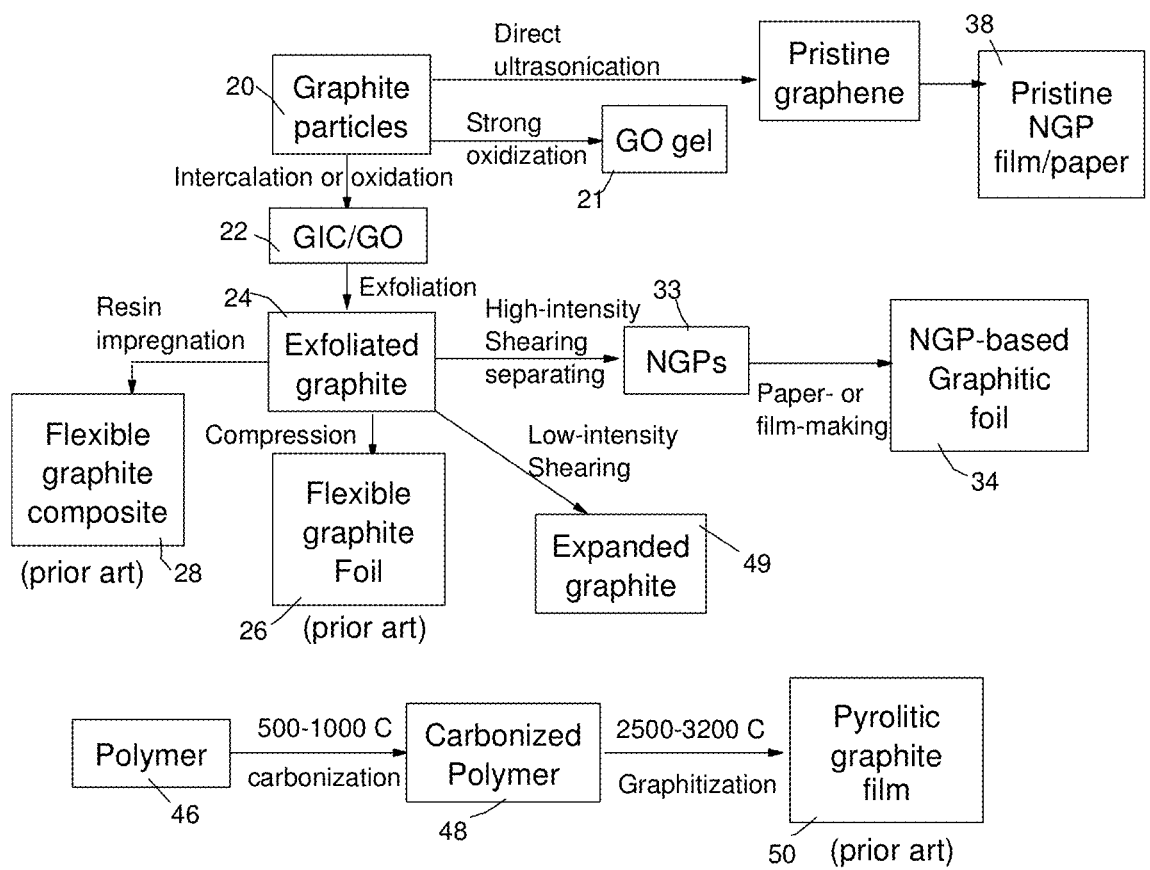
FIG. 1(a) A flow chart illustrating various prior art processes of producing exfoliated graphite products (flexible graphite foils and flexible graphite composites) and pyrolytic graphite (bottom portion), along with processes for producing graphene oxide gel and GO gel-coated laminates.
Figure 1B:
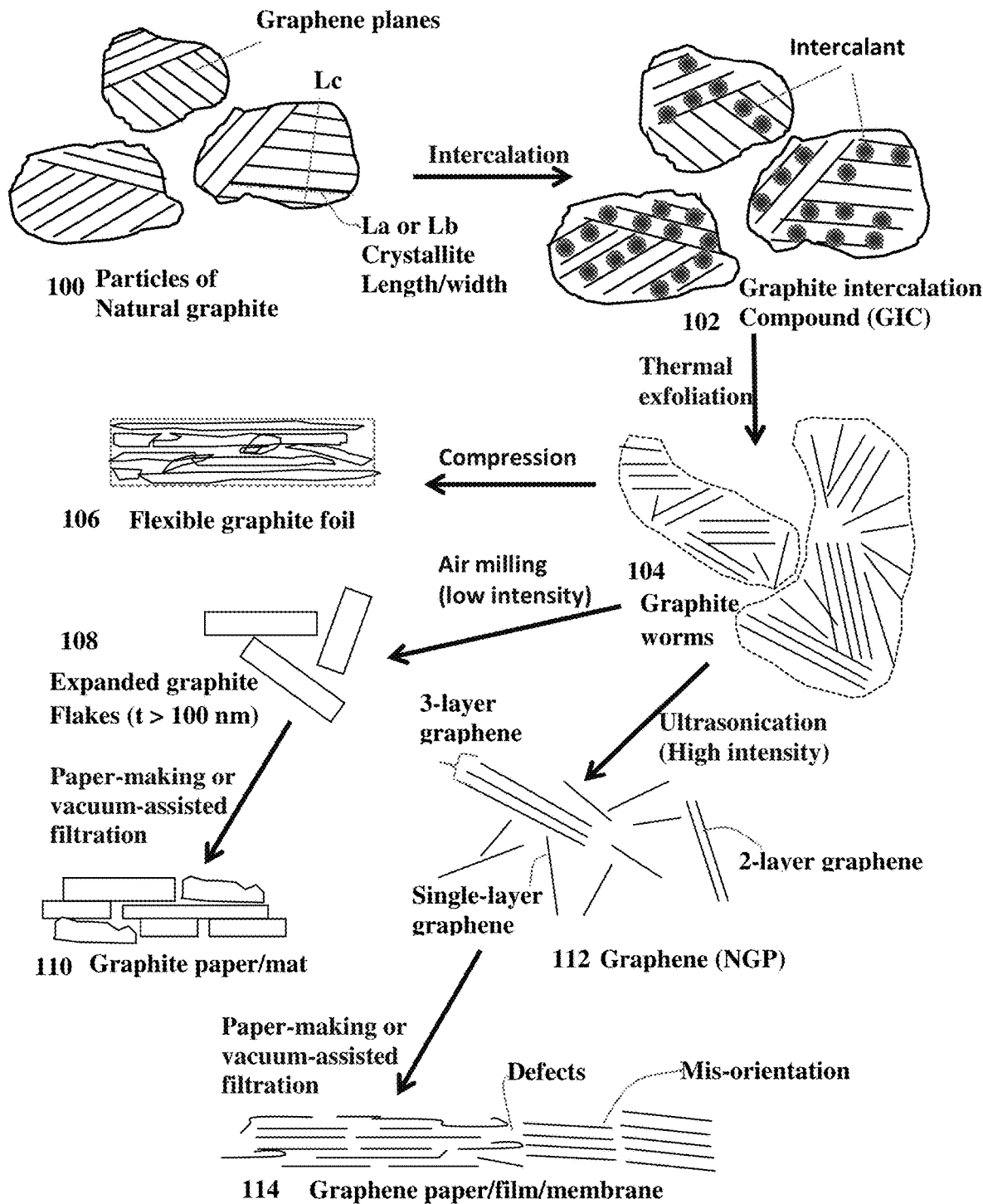
FIG. 1(b) Schematic drawing illustrating the processes for producing paper, mat, film, and membrane of simply aggregated graphite or NGP flakes/platelets. All processes begin with intercalation and/or oxidation treatment of graphitic materials (e.g. natural graphite particles).
Figure 1C:
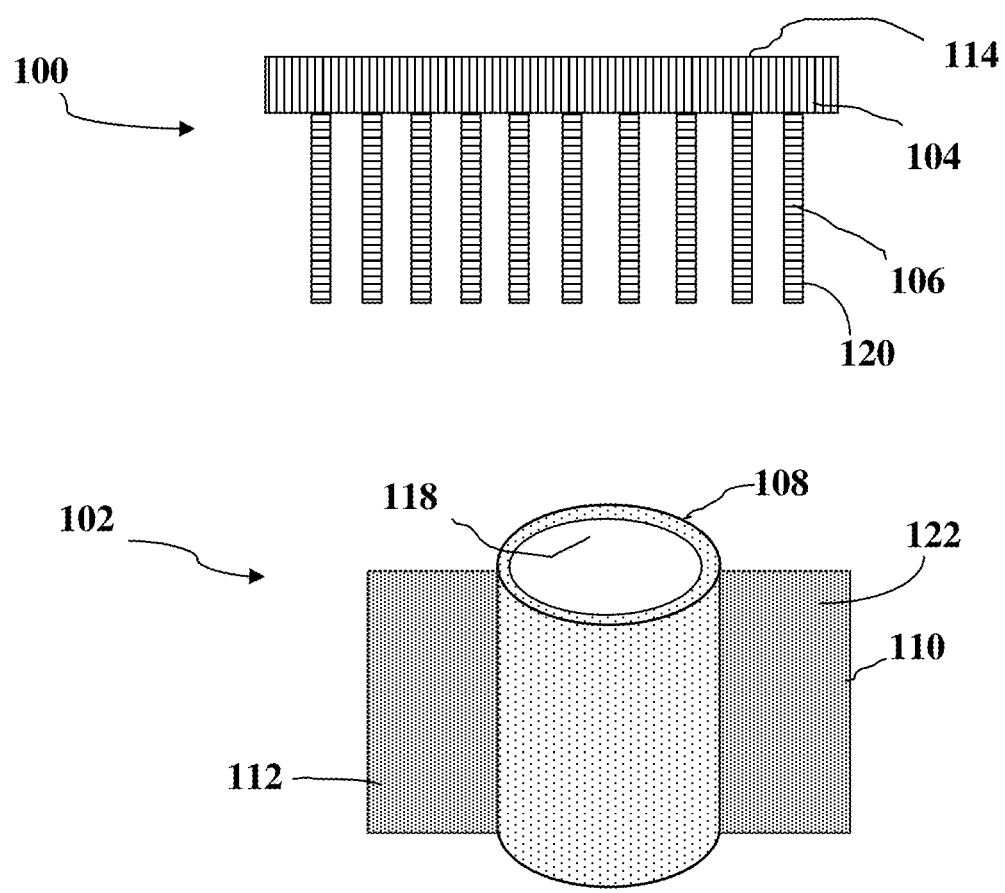
FIG. 1(c) Schematic of two heat sinks: 100 and 102.

As illustrative examples, FIG. 1(c) provides a schematic of two heat sinks: 100 and 102. The first one contains a heat collection member (or base member) 104 and multiple fins or heat dissipation members (e.g. fin 106) connected to the base member 104. The base member 104 is shown to have a heat collection surface 114 intended to be in thermal contact with a heat source. The heat dissipation member or fin 106 is shown to have at least a heat dissipation surface 120.

A particularly useful embodiment is an integrated radial heat sink 102 comprising a radial finned heat sink assembly that comprises: (a) a base 108 comprising a heat collection surface 118; and (b) a plurality of spaced parallel planar fin members (e.g. 110, 112 as two examples) supported by or integral with the base 108, wherein the planar fin members (e.g. 110) comprise the at least one heat dissipation surface 122. Multiple parallel planar fin members are preferably equally spaced.

The present invention provides an integrated finned heat sink formed of a nanographene platelet-reinforced matrix composite. The finned heat sink has a base and a plurality of fins integral to the base. In one preferred embodiment, the NGP-reinforced composite is composed of: (a) multiple nanographene platelets (NGPs) occupying 1-90% by weight of the resulting composite; (b) an optional second filler or reinforcement phase (e.g. particles or filaments of carbon, graphite, metal, glass, ceramic, and/or polymer) occupying 0.1-50% by weight; and (c) a matrix material selected from a polymer (thermoplastic, thermoset, rubber, interpenetrating network polymer, etc), metal (including alloy), glass, ceramic, carbon (including amorphous carbon, polymeric carbon, CVD carbon, etc), graphite, pitch (including petroleum or coal tar pitch, mesophase pitch or liquid crystalline pitch), or a combination thereof.

Preferably, the second reinforcement phase contains a carbon or graphite filler phase selected from a carbon or graphite fiber, carbon or graphite nanofiber, carbon nanotube, carbon nanorod, mesophase carbon particle, mesocarbon microbead, exfoliated graphite flake with a thickness greater than 100 nm, exfoliated graphite or graphite worm, coke particle, needle coke, carbon black or acetylene black particle, activated carbon particle, or a combination thereof. The second reinforcement phase occupies a weight fraction of 0.1% to 50% (preferably 1% to 20%) based on the total composite weight. The carbon or graphite filler phase is preferably in a particulate, filamentary, or rod-like form dispersed in the unitary graphene matrix. These discrete particles, filaments, and cylindrical shape fillers are the dispersed phase (reinforcement or filler phase) and the matrix material is the continuous phase.

As illustrated in FIG. 1(b), a graphite particle (e.g. 100) is typically composed of multiple graphite crystallites or grains. A graphite crystallite is made up of layer planes of hexagonal networks of carbon atoms. These layer planes of hexagonally arranged carbon atoms are substantially flat and are oriented or ordered so as to be substantially parallel and equidistant to one another in a particular crystallite. These layers of hexagonal-structured carbon atoms, commonly referred to as graphene layers or basal planes, are weakly bonded together in their thickness direction (crystallographic c-axis direction) by van der Waals forces and groups of these graphene layers are arranged in crystallites. The graphite crystallite structure is usually characterized in terms of two axes or directions: the c-axis direction and the a-axis (or b-axis) direction. The c-axis is the direction perpendicular to the basal planes. The a- or b-axes are the directions parallel to the basal planes (perpendicular to the c-axis direction).

A highly ordered graphite particle can consist of crystallites of a considerable size, having a length of $L_a$ along the crystallographic a-axis direction, a width of $L_b$ along the crystallographic b-axis direction, and a thickness $L_c$ along the crystallographic c-axis direction. The constituent graphene planes of a crystallite are highly aligned or oriented with respect to each other and, hence, these anisotropic structures give rise to many properties that are highly directional. For instance, the thermal and electrical conductivity of a crystallite are of great magnitude along the plane directions (a- or b-axis directions), but relatively low in the perpendicular direction (c-axis). As illustrated in the upper-left portion of FIG. 1(b), different crystallites in a graphite particle are typically oriented in different directions and, hence, a particular property of a multi-crystallite graphite particle is the directional average value of all the constituent crystallites.

Due to the weak van der Waals forces holding the parallel graphene layers, natural graphite can be treated so that the spacing between the graphene layers can be appreciably opened up so as to provide a marked expansion in the c-axis direction, and thus form an expanded graphite structure in which the laminar character of the carbon layers is substantially retained. The process for manufacturing flexible graphite is well-known. In a commonly used process, flakes of natural graphite (e.g. 100 in FIG. 1(b)) are intercalated in an acid solution to produce graphite intercalation compounds (GICs, 102). The GICs are washed, dried, and then exfoliated by exposure to a high temperature for a short period of time. This causes the flakes to expand or exfoliate in the c-axis direction of the graphite up to 80-300 times of their original dimensions. The exfoliated graphite flakes are vermiform in appearance and, hence, are commonly referred to as worms 104. These worms of graphite flakes which have been greatly expanded can be formed without the use of a binder into cohesive or integrated sheets of expanded graphite, e.g. webs, papers, strips, tapes, foils, mats or the like (typically referred to as "flexible graphite" 106) having a typical density of about 0.04-1.6 g/cm³ for most applications.

Figure 2A:
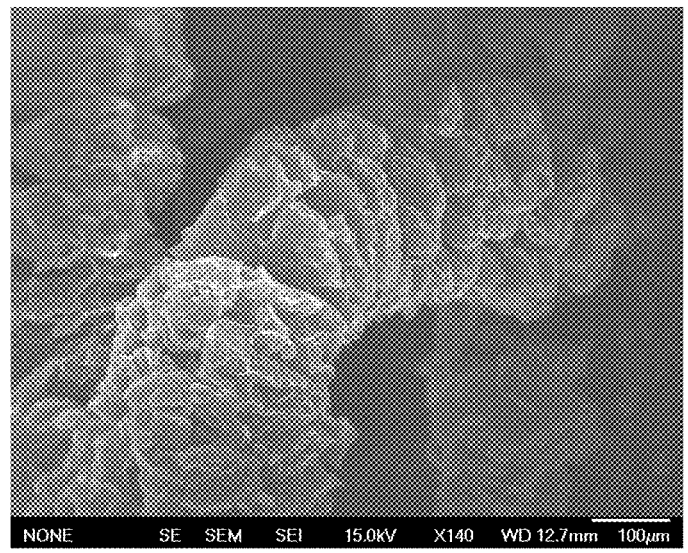
FIG. 2(a) A SEM image of a graphite worm sample after thermal exfoliation of graphite intercalation compounds (GICs) or graphite oxide powders.

The upper left portion of FIG. 1(a) shows a flow chart that illustrates the prior art processes used to fabricate flexible graphite foils and the resin-impregnated flexible graphite composite. The processes typically begin with intercalating graphite particles 20 (e.g., natural graphite or synthetic graphite) with an intercalant (typically a strong acid or acid mixture) to obtain a graphite intercalation compound 22 (GIC). After rinsing in water to remove excess acid, the GIC becomes "expandable graphite." The GIC or expandable graphite is then exposed to a high temperature environment (e.g., in a tube furnace preset at a temperature in the range from 800-1,050° C.) for a short duration of time (typically from 15 seconds to 2 minutes). This thermal treatment allows the graphite to expand in its c-axis direction by a factor of 30 to several hundreds to obtain a worm-like vermicular structure 24 (graphite worm), which contains exfoliated, but un-separated graphite flakes with large pores interposed between these interconnected flakes. An example of graphite worms is presented in FIG. 2(a).

Figure 2B:
FIG. 2(b) An SEM image of a cross-section of a flexible graphite foil, showing many graphite flakes with orientations not parallel to the flexible graphite foil surface and also showing many defects, kinked or folded flakes.

In one prior art process, the exfoliated graphite (or mass of graphite worms) is re-compressed by using a calendering or roll-pressing technique to obtain flexible graphite foils (26 in FIG. 1(a) or 106 in FIG. 1(b)), which are typically much thicker than 100 µm. An SEM image of a cross-section of a flexible graphite foil is presented in FIG. 2(b), which shows many graphite flakes with orientations not parallel to the flexible graphite foil surface and there are many defects and imperfections.

Largely due to these mis-orientations of graphite flakes and the presence of defects, commercially available flexible graphite foils normally have an in-plane electrical conductivity of 1,000-3,000 S/cm, through-plane (thickness-direction or Z-direction) electrical conductivity of 15-30 S/cm, in-plane thermal conductivity of 140-300 W/mK, and through-plane thermal conductivity of approximately 10-30 W/mK. These defects and mis-orientations are also responsible for the low mechanical strength, typically <10 MPa (e.g. defects are potential stress concentration sites where cracks are preferentially initiated). These properties are inadequate for many thermal management applications and the present invention is made to address these issues. In another prior art process, the exfoliated graphite worm 24 may be impregnated with a resin and then compressed and cured to form a flexible graphite composite 28, which is normally of low strength as well (tensile strength typically <30 MPa). In addition, upon resin impregnation, the electrical and thermal conductivity of the graphite worms could be reduced by up to two orders of magnitude.

Alternatively, the exfoliated graphite may be subjected to high-intensity mechanical shearing/separation treatments using a high-intensity air jet mill, high-intensity ball mill, or ultrasonic device to produce separated nanographene platelets 33 (NGPs) with all the graphene platelets thinner than 100 nm, mostly thinner than 10 nm, and, in many cases, being single-layer graphene (also illustrated as 112 in FIG. 1(b). An NGP is composed of a graphene sheet or a plurality of graphene sheets with each sheet being a two-dimensional, hexagonal structure of carbon atoms.

The starting graphitic material to be oxidized or intercalated for the purpose of forming graphene platelets through thermal exfoliation and/or ultrasonication may be selected from natural graphite, artificial graphite, mesophase carbon, mesophase pitch, mesocarbon microbead, soft carbon, hard carbon, coke, carbon fiber, carbon nanofiber, carbon nanotube, or a combination thereof. The graphitic material is preferably in a powder or short filament form having a dimension lower than 20 µm, more preferably lower than 10 µm, further preferably smaller than 5 µm, and most preferably smaller than 1 µm.

Further alternatively, with a low-intensity shearing, graphite worms tend to be separated into the so-called expanded graphite flakes (108 in FIG. 1(*b*)) having a thickness >100 nm. These flakes can be formed into graphite paper or mat 106 using a paper- or mat-making process. This expanded graphite paper or mat 106 is just a simple aggregate or stack of discrete flakes having defects, interruptions, and misorientations between these discrete flakes. However, isolated expanded graphite flakes can serve as a second reinforcement phase that is used in combination with NGPs to form a NGP-reinforced composite heat sink of the present invention.

For the purpose of defining the geometry and orientation of an NGP, the NGP is described as having a length (the largest dimension), a width (the second largest dimension), and a thickness. The thickness is the smallest dimension, which is no greater than 100 nm, preferably smaller than 10 nm in the present application. When the platelet is approximately circular in shape, the length and width are referred to as diameter. In the presently defined NGPs, both the length and width can be smaller than 1 µm, but can be larger than 200 µm.

A mass of multiple NGPs (including discrete sheets/platelets of single-layer and/or few-layer graphene, 33 in FIG. 1(*a*)) may be made into a graphene film/paper (34 in FIG. 1(*a*) or 114 in FIG. 1(*b*)) using a film- or paper-making process. Graphene films or papers can exhibit a good in-plane thermal conductivity. However, once the discrete graphene sheets or platelets are formed into a graphene paper/film, one can no longer impregnate the paper/film with a required amount of matrix resin to make a composite of adequate mechanical strength for heat sink applications.

Figure 3A:
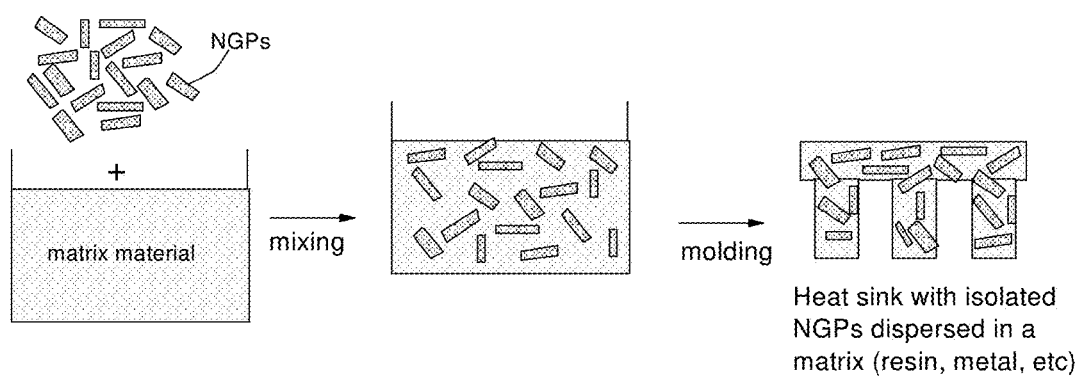
FIG. 3(A) Processes of producing NGP-reinforced composite heat sinks.

NGP-reinforced composite heat sinks may be produced by several conventional or non-conventional processing techniques. For instance, as schematically shown in FIG. 3(A), one may choose to disperse NGPs in a matrix material (e.g. a polymer such as epoxy resin or metal such as aluminum), the resulting mixture is then cast or injected into desirably shaped cavities of a molding tool. Upon solidification, the resulting mixture becomes a composite heat sink. This is an example of conventional molding processes that can be used to make NGP-reinforced composite-based integrated heat sinks. However, after extensive and intensive experimentation, we have come to realize that it is very difficult to use a conventional molding process, such as injection molding, to produce NGP-reinforced composite heat sinks when the NGP and optional second reinforcement phase, in combination, exceeds 20-25% by weight of the total composite weight (a practical limit of 25% by weight of reinforcement for a metal matrix and 20% for a resin matrix). It is practically impossible to make a composite heat sink of an intricate or complex shape (e.g. those containing thin and long fins) if the reinforcement amount exceeds 10% by weight. Also quite significantly and unexpectedly, NGP-reinforced resin composites do not exhibit a thermal conductivity higher than 10 W/mK even when the NGP loading is as high as 25% by weight. This is odd considering the fact that individual graphene sheets or platelets have a thermal conductivity of 2,000-5,300 W/mK (depending upon the number of graphene planes in the platelet). The values of 0.8-7 W/mK exhibited by NGP-reinforced epoxy composites containing 1-25% by weight of NGPs are orders of magnitude lower than what would be predicted by composite materials theories (e.g. according to the rule-of-mixture laws).

For these reasons, we decided to conduct an in-depth investigation into the causes for these relatively low thermal conductivity values and to develop effective strategies to overcome these serious issues. After some diligent studies, we have developed several cost-effective processes for producing NGP-reinforced composite heat sinks of complex shapes that exhibit exceptional thermal conductivity not achievable with conventional resin composites or NGP-reinforced composites produced by using conventional processing techniques. Preferred embodiments of these discoveries are described as follows:

One preferred embodiment of the present invention is a unique process of producing a NGP-reinforced composite integrated heat sink. The process comprises: (a) providing a plurality of nanographene platelets (NGPs); (b) assembling the NGPs into a porous preform; (c) mixing or impregnating the preform with a matrix material to form an impregnated preform; and (d) shaping and/or solidifying the impregnated preform to produce the integrated heat sink.

The step of assembling multiple NGPs into a preform may be accomplished in several manners. In one preferred embodiment, one can use compressed air to blow NGPs (alone or in combination with particles of a second reinforcement phases, such as carbon nanotubes or expanded graphite flakes) onto or into a shaping tool to obtain a preform. One can then blow an UV-curable or radiation-curable adhesive to bond reinforcement particles together at their points of contact (where they intersect each other) and then activate the curing of the adhesive with UV or other high energy radiation to harden the adhesive for fixing or rigidizing the porous preform, which is in a heat sink shape or a precursor shape.

The heat sink-shaped porous preform has the NGPs, optionally along with particles of a second reinforcement, forming a 3-D network of electron-conducting paths. Individual NGPs and other particles are bonded together at their intersection points. This porous preform is then impregnated or infiltrated with a matrix material; e.g. liquid metal, resin, or glass, which is then solidified to produce the desired NGP-reinforced composite heat sink.

Figure 3B:
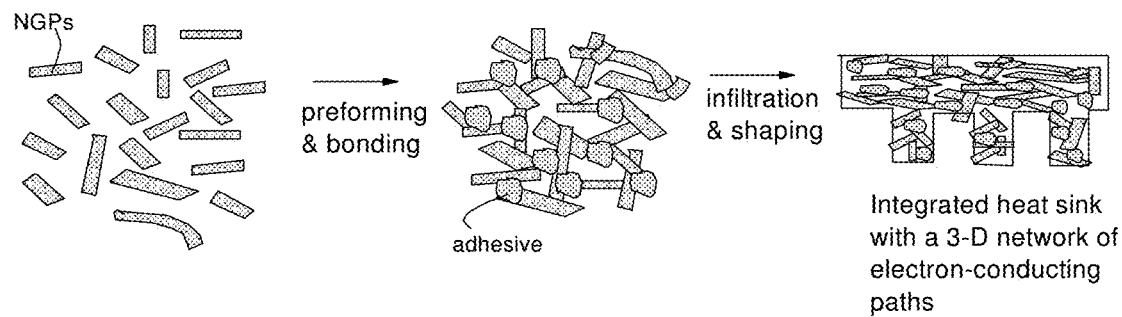
FIG. 3(B) Processes of producing NGP-reinforced composite heat sinks.

If the rigidized preform is just a precursor shape (not the final shape yet), then the preform can be first impregnated with a matrix material (e.g. a resin) or its precursor (e.g. a monomer to be polymerized later). The impregnated preform is then subjected to a final shaping operation (e.g. using a set of shaping tools) with the matrix material or its precursor being cured, hardened, polymerized, or solidified to form an integrated heat sink (an example being schematically illustrated in FIG. 3(B)).

In another preferred embodiment, step (b) comprises assembling the NGPs and a flowable or meltable adhesive to form a porous preform and activating the adhesive to bond the NGPs together to obtain a preform of structural integrity. The flowable or meltable adhesive may be in the form of solid thermoplastic fibers or particles that are initially co-mixed with NGPs (along with optional second reinforcement phase particles/fibers) to form a preform shape. The subsequent activating operation may, for instance, include heating and melting thermoplastic fibers to form polymer melt, allowing the polymer melt to bond NGP together at certain points of contact, followed by solidifying the thermoplastic.

Thus, preferably, step (a) includes further providing a second discrete reinforcement phase selected from a particle, filament, nanotube, nanowire, or nanorod of a metal, ceramic, glass, polymer, carbon, graphite, or a combination thereof and step (b) includes assembling the NGPs and the second reinforcement phase into a porous preform. In particular, second reinforcement phase is advantageously selected from a carbon or graphite fiber, carbon or graphite nanofiber, carbon nanotube, carbon nanorod, mesophase carbon particle, mesocarbon microbead, expanded graphite flake with a thickness greater than 100 nm, exfoliated graphite or graphite worm, coke particle, needle coke, carbon black, acetylene black particle, activated carbon particle, or a combination thereof; wherein the carbon or graphite phase occupies a weight fraction of 1% to 50% based on the total composite weight.

Another embodiment of the present invention is a process of producing the integrated heat sink. The process comprises (a) providing a plurality of nanographene platelets (NGPs); (b) mixing the NGPs with a matrix material or its precursor to form a shapeable mixture; (c) using a molding tool to form the shapeable mixture into a desired shape wherein the NGPs form a three-dimensional network of electron- and phonon-conducting paths; and (d) curing or solidifying the mixture of a desired shape to produce the integrated heat sink. Preferably, step (a) includes further providing a second discrete reinforcement phase selected from a particle, filament, nanotube, nanowire, or nanorod of a metal, ceramic, glass, polymer, carbon, graphite, or a combination thereof and step (b) includes mixing the NGPs and the second reinforcement phase with a matrix material or its precursor to form a shapeable mixture.

Advantageously, the second reinforcement phase is selected from a carbon or graphite fiber, carbon or graphite nanofiber, carbon nanotube, carbon nanorod, mesophase carbon particle, mesocarbon microbead, expanded graphite flake with a thickness greater than 100 nm, exfoliated graphite or graphite worm, coke particle, needle coke, carbon black, acetylene black particle, activated carbon particle, or a combination thereof, wherein the carbon or graphite phase occupies a weight fraction of 1% to 50% based on the total composite weight. Most desirably, nanographene platelets and particles or filaments of the second reinforcement phase overlap each other to form a 3-D network of electron- and phonon-conducting paths, enabling high thermal conductivity.

A useful heat sink contains a radial finned heat sink assembly that comprises: (a) a base comprising said heat collection member; and (b) a plurality of spaced fin members supported by or integral with the base, wherein the fin members comprise the at least one heat dissipation member. Both the base members and the fin members are made from NGP-reinforced composites.

Preferably, at least one heat dissipation member (fin) comprises a surface coated with a high-emissivity material having an emissivity greater than an emissivity of the unitary graphene material. The high-emissivity material may be selected from aluminum oxide, zinc oxide, aluminum nitride, titanium oxide, boron nitride, silicon carbide, silicon nitride, gallium nitride, or a combination thereof. Actually, the high-emissivity material may be selected from a wide variety of metal or ceramic nanoparticles.

Example 1: Preparation of Discrete Nanographene Platelets (NGPs) and Expanded Graphite Flakes Chopped graphite fibers with an average diameter of 12 μm and natural graphite particles were separately used as a starting material, which was immersed in a mixture of concentrated sulfuric acid, nitric acid, and potassium permanganate (as the chemical intercalate and oxidizer) to prepare graphite intercalation compounds (GICs). The starting material was first dried in a vacuum oven for 24 h at 80° C. Then, a mixture of concentrated sulfuric acid, fuming nitric acid, and potassium permanganate (at a weight ratio of 4:1:0.05) was slowly added, under appropriate cooling and stirring, to a three-neck flask containing fiber segments. After 16 hours of reaction, the acid-treated graphite fibers or natural graphite particles were filtered and washed thoroughly with deionized water until the pH level of the solution reached 6. After being dried at 100° C. overnight, the resulting graphite intercalation compound (GIC) was subjected to a thermal shock at 1050° C. for 45 seconds in a tube furnace to form exfoliated graphite (or graphite worms).

Five grams of the resulting exfoliated graphite (graphite worms) were mixed with 2,000 ml alcohol solution consisting of alcohol and distilled water with a ratio of 65:35 for 12 hours to obtain a suspension. Then the mixture or suspension was subjected to ultrasonic irradiation with a power of 200 W for various lengths of time. After two hours of sonication, EG particles were effectively fragmented and separated into thin NGPs. The suspension was then filtered and dried at 80° C. to remove residue solvents. The as-prepared NGPs have an average thickness of approximately 9.7 nm.

Another five grams of the resulting exfoliated graphite (EG) were subjected to low-intensity air jet milling to break up graphite worms, forming expanded graphite flakes (having an average thickness of 139 nm).

Example 2: Preparation of Single-Layer Graphene Sheets from Mesocarbon Microbeads (MCMBs)

Mesocarbon microbeads (MCMBs) were supplied from China Steel Chemical Co. This material has a density of about 2.24 g/cm$^3$ with a median particle size of about 16 μm. MCMB (10 grams) were intercalated with an acid solution (sulfuric acid, nitric acid, and potassium permanganate at a ratio of 4:1:0.05) for 72 hours. Upon completion of the reaction, the mixture was poured into deionized water and filtered. The intercalated MCMBs were repeatedly washed in a 5% solution of HCl to remove most of the sulfate ions. The sample was then washed repeatedly with deionized water until the pH of the filtrate was neutral. The slurry was dried and stored in a vacuum oven at 60° C. for 24 hours. The dried powder sample was placed in a quartz tube and inserted into a horizontal tube furnace pre-set at a desired temperature, 1,080° C. for 45 seconds to obtain a graphene material. TEM and atomic force microscopic studies indicate that most of the NGPs were single-layer graphene.

Example 3: Preparation of Pristine Graphene Sheets/Platelets

In a typical procedure, five grams of graphite flakes, ground to approximately 20 μm or less in sizes, were dispersed in 1,000 mL of deionized water (containing 0.1% by weight of a dispersing agent, Zonyl® FSO from DuPont) to obtain a suspension. An ultrasonic energy level of 85 W (Branson S450 Ultrasonicator) was used for exfoliation, separation, and size reduction of graphene sheets for a period of 15 minutes to 2 hours.

Example 4: Preparation of Graphene Oxide (GO)

Graphite oxide gel was prepared by oxidation of graphite flakes with an oxidizer liquid consisting of sulfuric acid, sodium nitrate, and potassium permanganate at a ratio of 4:1:0.05 at 30° C. When natural graphite flakes (particle sizes of 14 μm) were immersed and dispersed in the oxidizer mixture liquid, the suspension or slurry appears optically opaque and dark. The suspension remains opaque during the first 52 hours of reaction. However, the suspension gradually turns optically translucent (a little cloudy) when the reaction time exceeds 52 hours, and the color of the suspension changes from black to dark brown. This oxidation procedure was stopped after 72 hours and the suspension was rinsed several times with deionized water and then ultrasonicated for 10 minutes. The resulting suspension contains essentially single-layer graphene oxide sheets, which was dried with GO powder recovered. Different batches of GO powder was thermally treated at 150-700° C. for different periods of time to obtain reduced graphene oxide (RGO) containing different oxygen contents (typically from 10% down to essentially 0%). NGPs refer to pristine graphene, graphene oxide, RGO, functionalized graphene or GO, doped graphene or GO, etc.

Example 5: Electrical and Thermal Conductivity and Tensile Strength Measurements of Various NGP Composites Four-point probe tests were conducted to measure the electrical conductivity of NGP-reinforced composites (optionally containing CNT, expanded graphite flakes, carbon black, etc. as a second reinforcement phase). Their in-plane thermal conductivity was measured using a laser flash method (Netzsch Thermal Diffusivity Device). A universal testing machine was used to determine the tensile strength of these materials.

Figure 4A:
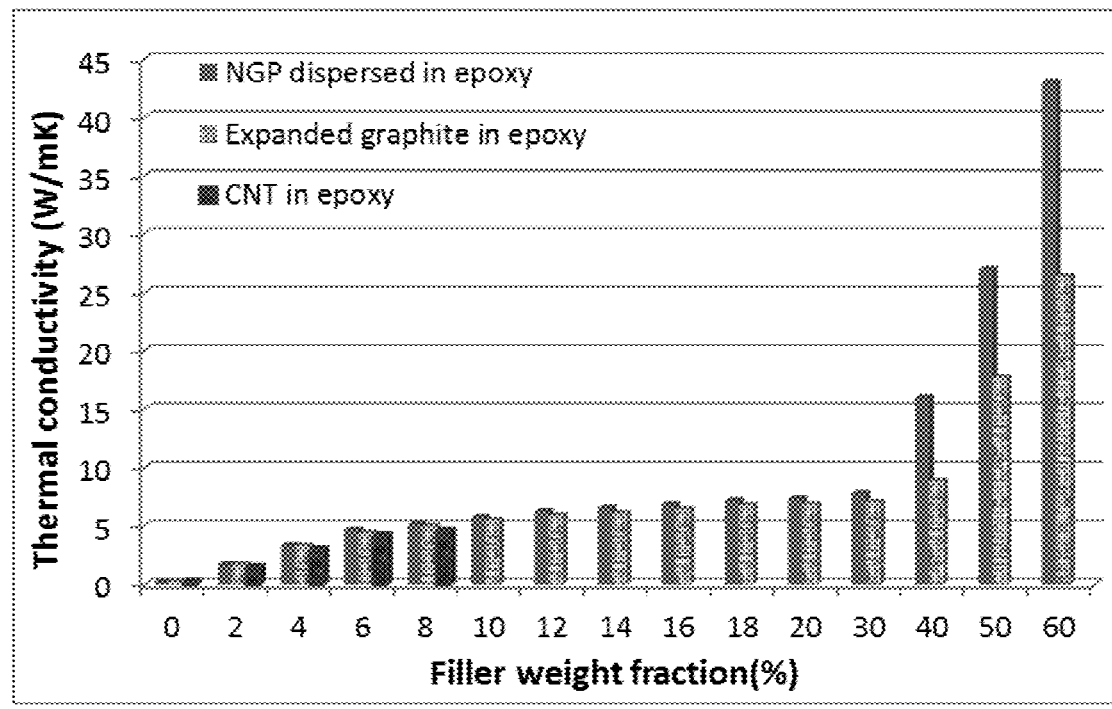
FIG. 4(a) The thermal conductivity data for NGP-epoxy, expanded graphite-epoxy, and multi-walled CNT-epoxy plotted over a broad range of filler weight fractions.
Figure 4B:
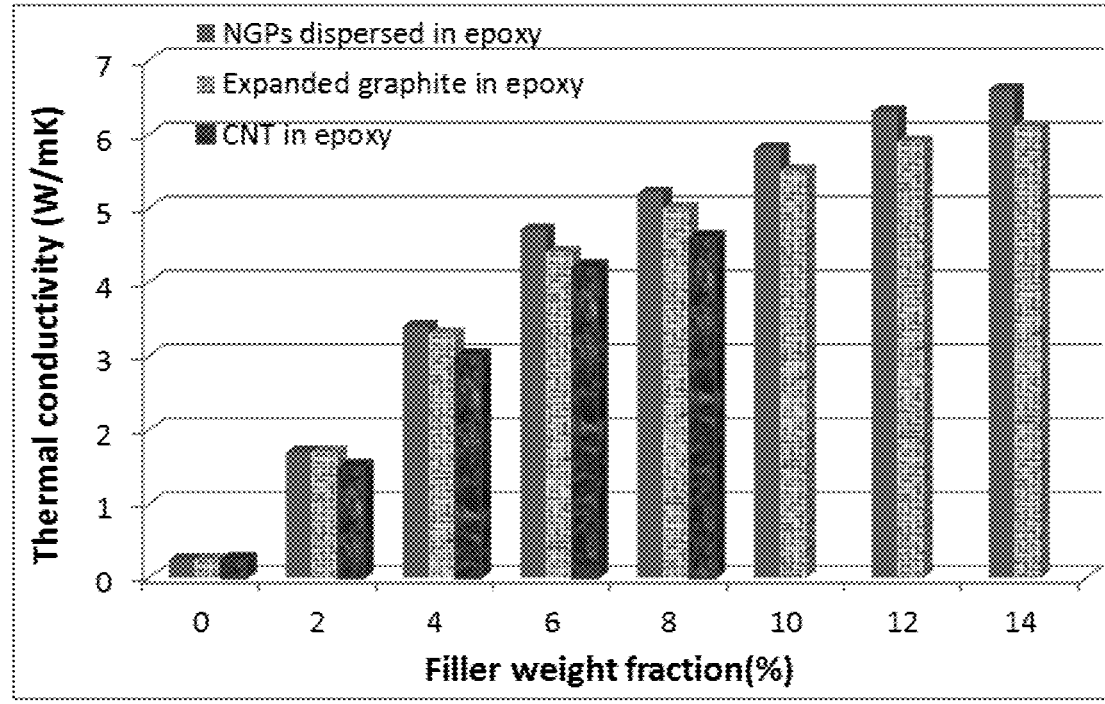
FIG. 4(b) Thermal conductivity values for the lower filler weight fraction range.

The first set of data is for thermoset matrix composites. FIG. 4(a) and FIG. 4(b) show the thermal conductivity data for NGP-epoxy, expanded graphite-epoxy, and multi-walled CNT-epoxy plotted over a broad range of filler weight fractions. FIG. 4(a) covers a wider filler weight fraction range. In each case, the fillers are well dispersed in the epoxy resin matrix. It was difficult to disperse CNTs in the epoxy resin matrix when the CNT weight fraction exceeds 8%. These data indicate that the thermal conductivity values of NGP-epoxy composites are significantly higher than their expanded graphite-epoxy counterparts, which are in turn greater than those of CNT-epoxy composites. NGP-reinforced composites are the best heat sink materials among this group of composites.

Figure 4C:
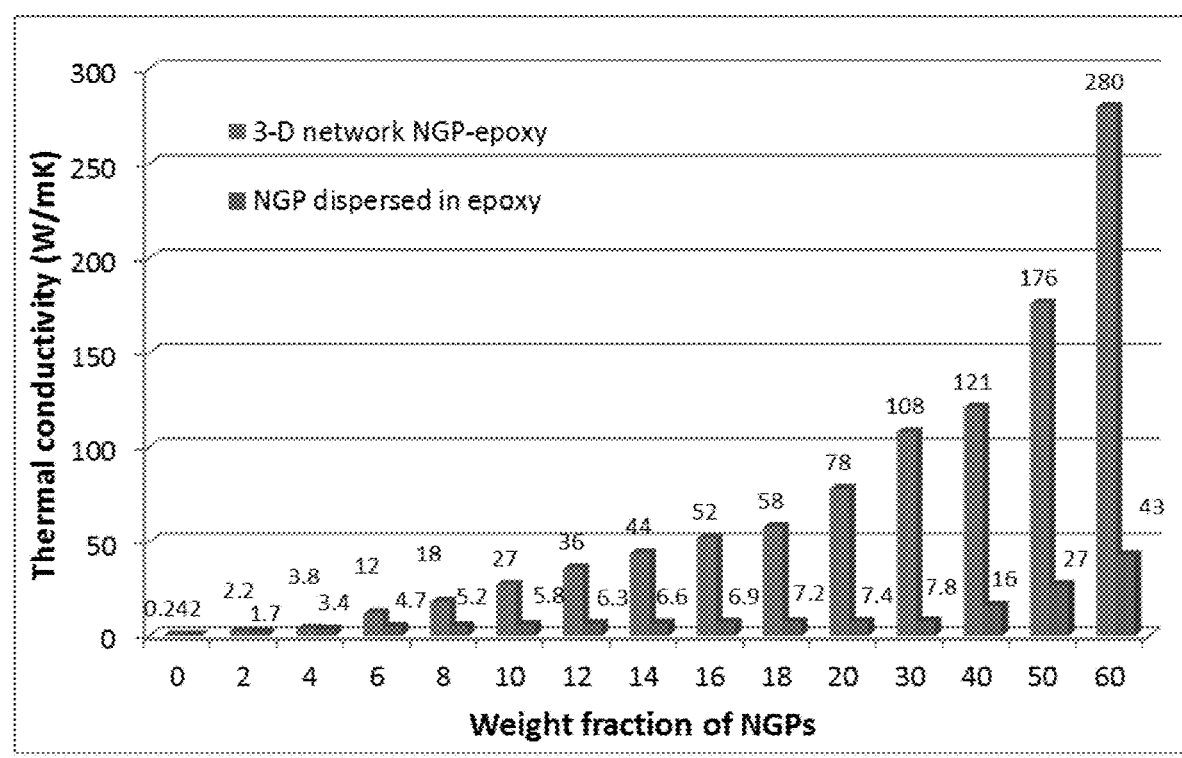
FIG. 4(c) The thermal conductivity data of 3-D network of NGPs impregnated with epoxy, in comparison with the data of dispersed NGP composites of FIG. 4(a).

We also prepared another group of NGP-reinforced epoxy matrix composite wherein multiple NGPs are formed into a highly porous shape and individual graphene platelets were bonded together with an UV-curable adhesive, which was air-blown to deposit at NGP-NGP points of contact. The adhesive was cured to "harden" the porous NGP mat that essentially constitutes a 3-D network of electron- and phonon-conducting pathways. This porous mat was then compressed to a desired ratio to generate a desired volume to accommodate the resin. The volume compression ratio of the porous mat can be varied to achieve various levels of porosity. The pores were than impregnated with a desired amount of the epoxy resin. The impregnated mat may be optionally compressed again if so desired. The composite was then cured to obtain a 3-D network NGP-reinforced composite. The thermal conductivity data of this unique class of NGP-epoxy composite are presented in FIG. 4(c), alongside the data of dispersed NGP composites described in FIG. 4(a). The differences in thermal conductivity between these two classes of NGP-reinforced epoxy composites are most striking. The two classes of composites have the same epoxy and the same amounts of the same NGPs, yet exhibiting completely different behaviors.

Figure 5:
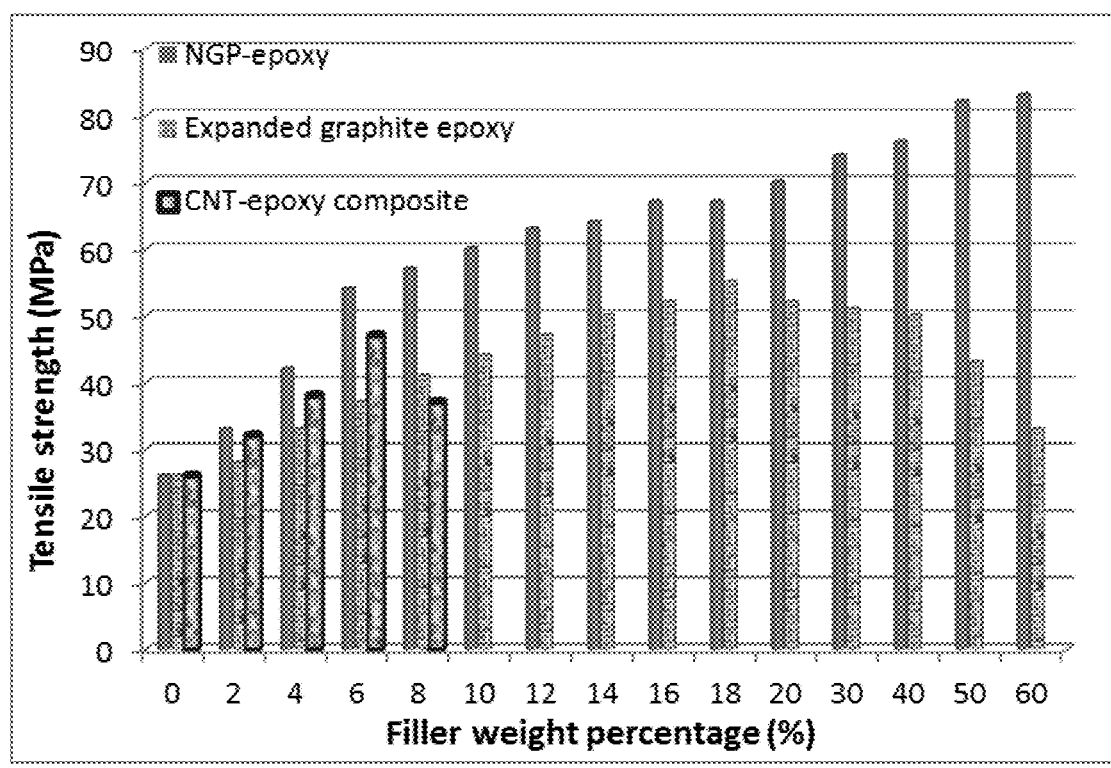
FIG. 5 The tensile strength values of NGP-epoxy composites, expanded graphite particle-reinforced epoxy composite, and multi-walled CNT-reinforced epoxy composite samples plotted as a function of the filler weight fraction.

The tensile strength values of NGP-epoxy composites, expanded graphite particle-reinforced epoxy composite, and multi-walled CNT-reinforced epoxy composite samples are plotted as a function of the filler weight fraction, as shown in FIG. 5. These data have demonstrated that the tensile strength of the NGP-epoxy composites increases monotonically with the NGP weight fraction, from 26 MPa of the neat resin to a value of 82 MPa at 50% NGP. This is an improvement by a factor of >3. In contrast, both expanded graphite flakes (thickness>100 nm, by definition) and CNTs increase the tensile strength of epoxy initially as the filler proportion increases. However, when the expanded graphite weight fraction exceeds 18% or CNT fraction exceeds 6%, the tensile strength begins to decrease. The same trends are also observed when other polymer matrices than epoxy resin are used. This is completely unexpected. The NGPs used in the epoxy matrix have an average thickness less than 10 nm. The NGPs used in other matrices are mostly single-layer graphene.

It may be noted that epoxy matrix composites containing multi-walled carbon nanotubes as the reinforcement phase have never exhibited a tensile strength higher than 80 MPa. This is partially due to the difficulty of dispersing CNTs in a polymer, to the extent that it has been extremely difficult to well-disperse more than 6% by weight of CNTs in epoxy. Beyond 6% by weight, CNTs could not be homogeneously dispersed in epoxy and the tensile strength actually begins to decrease with increasing CNT weight percentage.

Figure 6A:
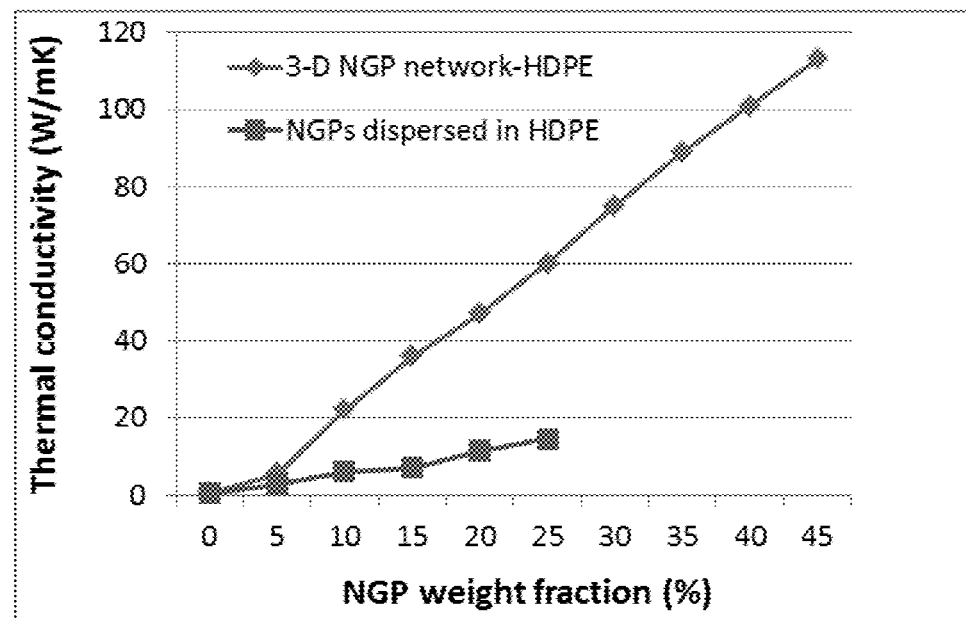
FIG. 6(a) The thermal conductivity values of two classes of NGP-reinforced high density polyethylene (HDPE) composites (3-D NGP network and dispersed NGPs) plotted as a function of the NGP weight fractions.

The second set of data is for thermoplastic matrix composites. As shown in FIG. 6(a) for one example, the thermal conductivity values of two classes of NGP-reinforced high density polyethylene (HDPE) composites are plotted as a function of the NGP weight fractions. One class of NGP composites was prepared by blending NGP powder with HDPE pellets in an extruder to obtain a NGP-HDPE mixture, which was extruded out and pelletized to obtain solid particles. The solid particles of NGP-HDPE mixture were then injection-molded into rectangular bars for thermal conductivity measurements. In these composites, NGPs are dispersed in the HDPE matrix. However, the HDPE composites containing more than 25% by weight of NGPs could not be injection-molded. This has been a commonly encountered problem associated with nanoparticle-reinforced polymers. We have overcome this long-standing problem by using a unique process to obtain the other class of NGP-HDPE composites (containing 3-D network of graphene platelets).

This other class was prepared by forming a thin porous NGP (0.1-1 mm thick) mat first. The mat was then sandwiched between two HDPE films, heated to melt out HDPE at 155° C., and compressed to force PE melt to permeate into the pores of the NGP mat. The impregnated mat was then solidified by cooling the composite under compression. This simple but unique process enables the combination and consolidation of NGPs of any loading level with HDPE (from a few % up to 90% by weight). This approach can be adapted to fabricate any polymer matrix composite containing 3-D network of NGPs or NGPs plus other fillers. FIG. 6(a) shows that this class of 3-D network NGP-based composites are capable of delivering significantly higher thermal conductivity values as compared with their dispersed NGP counterparts. The differences are surprisingly large. At comparable loading (e.g. 25% by weight) of NGPs, the 3-D network NGP composite exhibits a thermal conductivity of 60 W/mk, which is four times higher than that (14.6

W/mK) of the dispersed NGP composite. Additionally, even though the maximum amount of NGPs that can be dispersed in HDPE is 25%, there is no limitation on the NGP loading when this 3-D network NGP-impregnation approach is followed. At a loading of 45% NGPs, the composite delivers a thermal conductivity of 113 W/mK, which is higher than those of most metals. Although thermal conductivity values of select few metals are higher (e.g. 400 W/mK for Cu and 80-200 W/mK for Al alloy), the use of copper or aluminum heat sinks can present a problem because of the weight of the metal. For instance, pure copper weighs 8.96 g/cm$^3$ and pure aluminum weighs 2.70 g/cm$^3$. The physical densities of the NGP-reinforced composites are typically in the range from 1.2-1.8 g/cm$^3$.

Figure 6B:
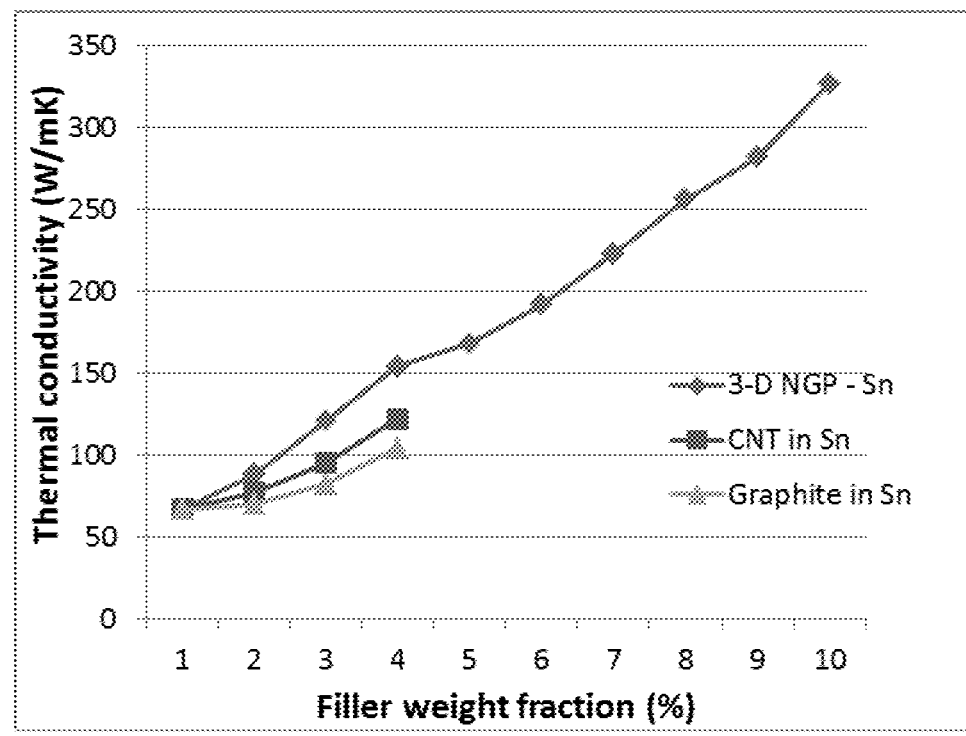
FIG. 6(b) the thermal conductivity values of three classes of tin (Sn) matrix composites plotted as a function of the filler weight fractions: the reinforcement phase being NGPs, CNTs, and spherical graphite particles.

The third set of data is for metal matrix composites. As shown in FIG. 6(b) for one example, the thermal conductivity values of three classes of tin (Sn) matrix composites are plotted as a function of the filler weight fractions: the reinforcement phase being NGPs, CNTs, and spherical graphite particles (approximately 10 μm in diameter). These data indicate that 3-D NGPs are much more effective than either CNTs or graphite particles in terms of enhancing the thermal conductivity of a metal. Further, CNTs cannot be loaded into Sn for more than 15% by weight, but there is no practical limit on 3-D NGPs. A thermal conductivity as high as 327 W/mK has been achieved with a composite physical density of 4.1 g/cm$^3$ (vs. 380-400 W/mK for Cu at a density of 8.96 g/cm$^3$).

Figure 7:
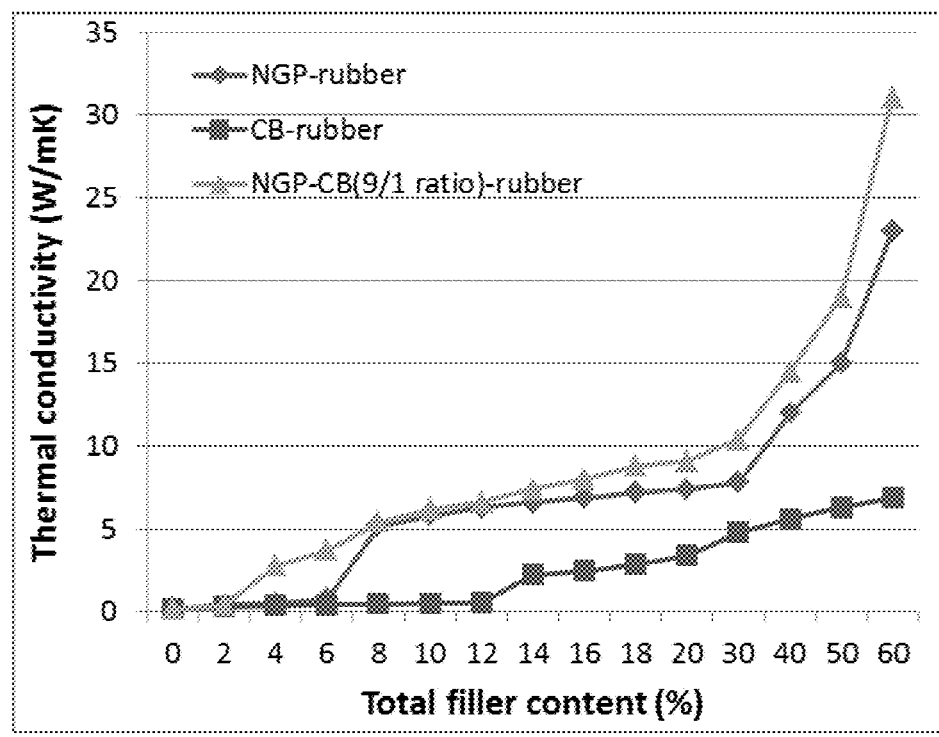
FIG. 7 The thermal conductivity values of three classes of silicone rubber matrix composites plotted as a function of the overall filler weight fractions: the reinforcement phase being NGPs, carbon black (CB), and NGP-CB mixture.

The fourth set of data is for rubber matrix composites. The conductive fillers are NGPs, nanosized carbon black (20-40 nm CBs, Vulcan XC72 obtained from Cabot Corporation), and NGP-CB mixtures (with NGP/CB weight ratio being 9/1 over the entire total filler loading, from 0 to 60% by weight). The polymer matrix is PDMS (Sylgard 184 Silicone Elastomer) from Dow Corning. As shown in FIG. 7 as one example of matrix rubbers, the thermal conductivity values of three classes of silicone rubber matrix composites are plotted as a function of the filler weight fractions: the reinforcement phase being NGPs, carbon black (CB), and NGP-CB mixture). These data indicate that NGPs are much more effective than CB particles in terms of enhancing the thermal conductivity of a rubber. The most surprising observations, however, are on the so-called percolation threshold (critical weight fraction of a conductive filler) at which a composite exhibits an abrupt thermal conductivity increase. The percolation point for CB-rubber composite is about 13% by weight of CB and the percolation point for NGP-rubber composite is about 7% by weight of CB. When the reinforcement is a NGP-CB mixture, the percolation point is about 3%, indicating a synergistic effect between NGPs and carbon black particles. In addition, the rubber composites containing such a reinforcement mixture deliver significantly higher thermal conductivity values than either NGP or CB alone. The causes for the synergism remain unclear at this stage.

Figure 6C:
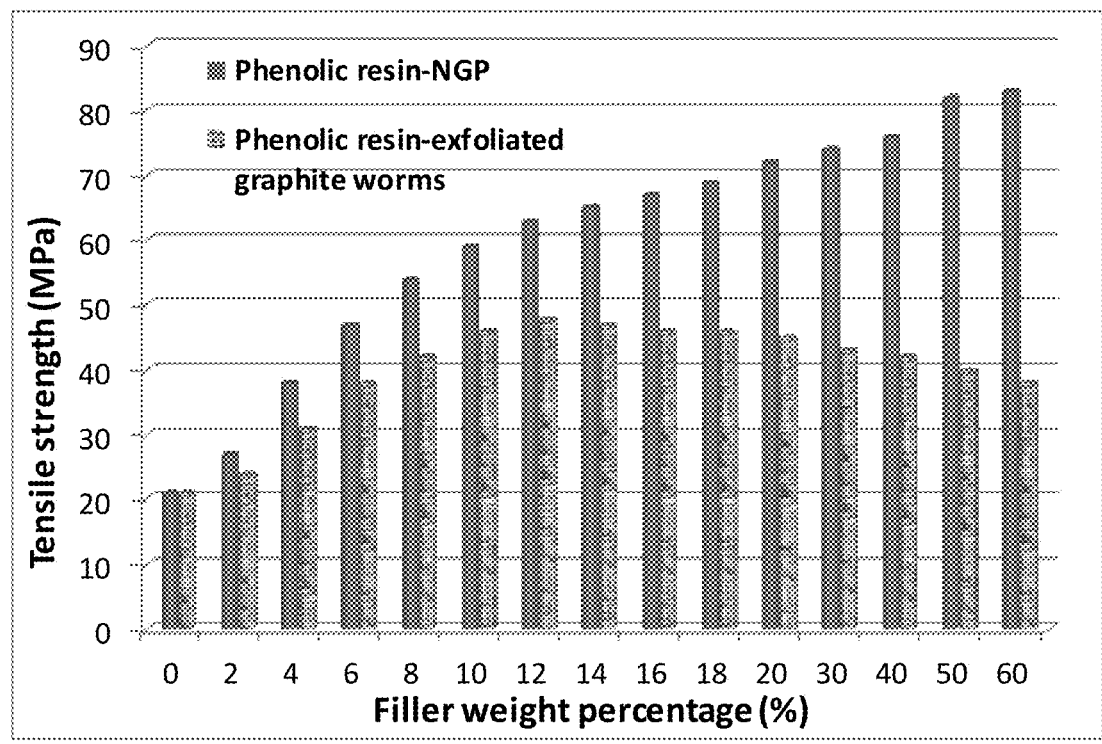
FIG. 6(c) Tensile strength of NGP-reinforced phenolic resin and exfoliated graphite (graphite worm)-reinforced phenolic resin.

The fifth set of data is for phenolic resin matrix composites and the derived graphite matrix composites obtained by carbonizing and graphitizing phenolic matrix composites. The tensile strength values of NGP-reinforced phenolic resin and corresponding exfoliated graphite (graphite worm)-reinforced phenolic resin are shown in FIG. 6(c), which indicates a monotonic increase in tensile strength of the phenolic resin composite as the NGP weight percentage increases. In contrast, as the exfoliated graphite worm increases, the tensile strength of the phenolic matrix composite increases until the graphite worm weight fraction reaches 12%, beyond which the strength decreases with the graphite worm loading. These data have clearly demonstrated the surprising superiority of NGPs over exfoliated graphite in terms of reinforcing a polymer.

Figure 6D:
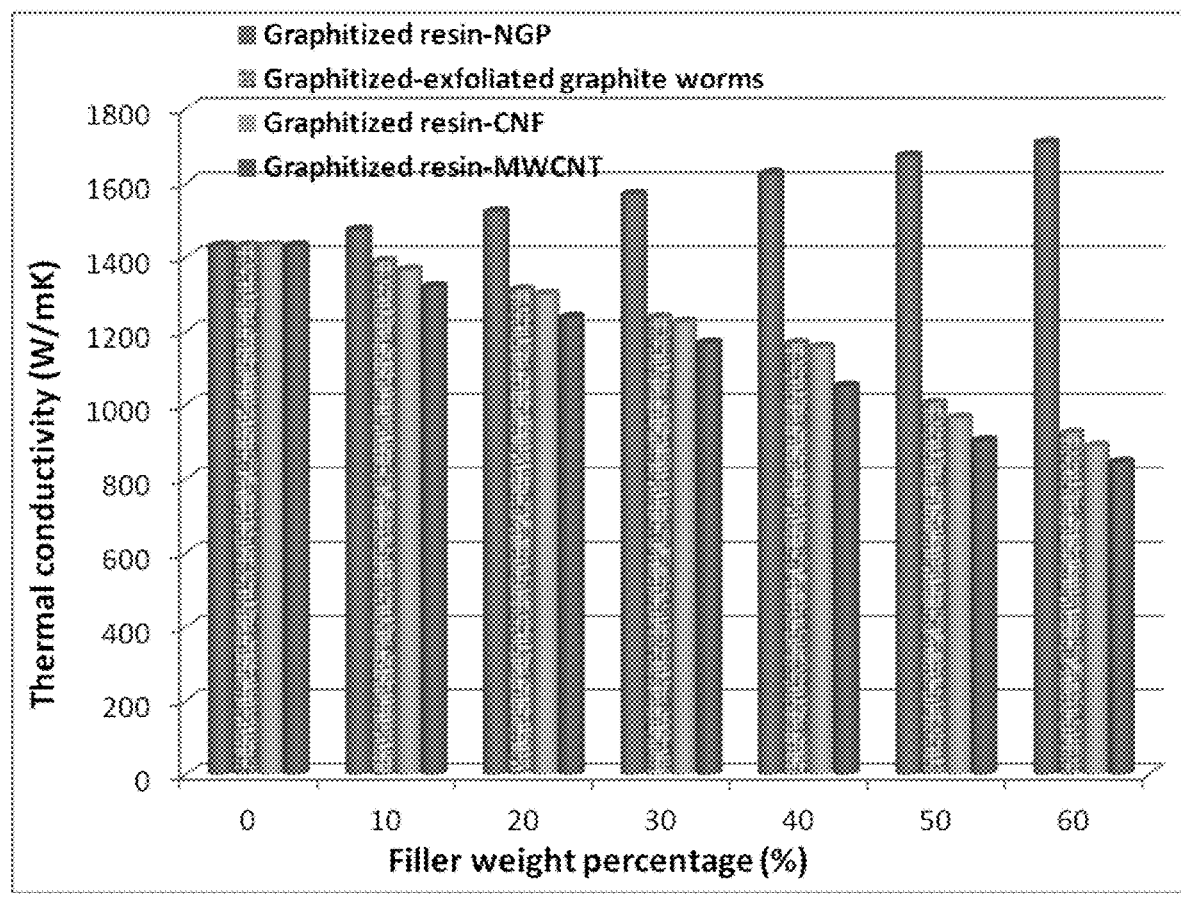
FIG. 6(d) Thermal conductivity values of NGP-reinforced graphite, graphite worm-reinforced graphite, CNF-reinforced graphite, and MWCNT-reinforced graphite matrix obtained by repeatedly carbonizing and graphitizing phenolic resin.

Various phenolic resin matrix composites containing the NGP, exfoliated graphite, CNF, and multi-walled CNT as a reinforcement were carbonized at 500° C. for 2 hours and 1,250° C. for 1 hour, and then graphitized at 2,500° C. for 1 hour. The phenolic resin becomes a graphite matrix as confirmed by X-ray diffraction data that indicates a $d_{002}$ spacing of approximately 0.336 nm. The thermal conductivity values of NGP-reinforced graphite matrix, graphite worm-reinforced graphite matrix, CNF-reinforced graphite matrix, and MWCNT-reinforced graphite matrix obtained by repeatedly carbonizing and graphitizing the corresponding precursor phenolic resin composites are summarized in FIG. 6(d). These data have clearly demonstrated the surprising superiority of NGPs over exfoliated graphite, CNFs, and CNTs in terms of reinforcing the thermal conductivity of a graphite matrix. As the proportion of the filler phase (exfoliated graphite, CNF, or CNT) increases, the thermal conductivity of the resulting graphite matrix composite actually decreases monotonically; the higher the filler loading, the lower the thermal conductivity. This is quite unexpected considering the observation that the graphite matrix itself has a thermal conductivity of 1,430 W/mK, which is lower than the thermal conductivity of the individual graphite flake (2,000 W/mK), carbon nanofiber (up to 1,900 W/mK), or carbon nanotube (2,000-3,000 W/mK). Most strikingly, the thermal conductivity of the NGP-reinforced graphite composite increases monotonically as the NGP loading level increases. This is in stark contrast to the behavior of the other three types of graphite matrix composites, clearly confirming that the NGP-reinforced graphite matrix composite is a class of material by itself.

Examples 6: Thermal and Electrical Properties of Various NGP-Reinforced Composites The thermal and electric conductivities of various NGP-reinforced composites containing various second reinforcement phase materials (e.g., various carbon or graphite fillers in different forms) are summarized in Table 1 below.

TABLE 1

| | In-plane thermal and electric conductivities | | | |
|---|---|---|---|---|
| Sample No. | Matrix material | Filler type, form, and wt. % | Thermal conductivity (W/mK) | Electrical conductivity (S/cm) |
| P-1 | Petroleum pitch | Dispersed NGPs (30%) only; no 2$^{nd}$ reinforcement | 312 | 4,100 |
| P-2 | Petroleum pitch | NGP (15%) + CNT (15%) | 268 | 3,420 |

TABLE 1-continued

In-plane thermal and electric conductivities

| Sample No. | Matrix material | Filler type, form, and wt. % | Thermal conductivity (W/mK) | Electrical conductivity (S/cm) |
|---|---|---|---|---|
| P-3-AB | Petroleum pitch | NGP (15%) + Acetylene black (15%) | 288 | 3,835 |
| MP-1 | Mesophase pitch | NGP (thickness = 9 nm, 15%) | 162 | 2,010 |
| MP-2 | Mesophase pitch | CNF (15%) | 87 | 950 |
| Poly-C-1 | Polymeric carbon (phenolic carbonized at 1,200° C.) | NGPs (single-layer, 15%) + MCMB (5%) | 225 | 2,340 |
| Poly-C-2 | Polymeric carbon | CNFs (15%) + MCMB (5%) | 102 | 1,130 |
| Poly-C-3 | Polymeric carbon, graphitized at 2,500° C. | NGPs (30%) | 1,569 | 12,000 |
| Poly-C-4 | Polymeric carbon, graphitized at 2,500° C. | NGPs (30%) + CNFs (5%) | 1,520 | 10,800 |

These data show that NGPs (alone or in combination with another reinforcement filler) are significantly more effective than either CNTs or CNFs (alone or in combination with another filler) in enhancing pitch, polymeric carbon, or graphite matrix composites.

Examples 7: Testing of Heat-Dissipating Effectiveness of Various Heat Sinks

Figure 8:
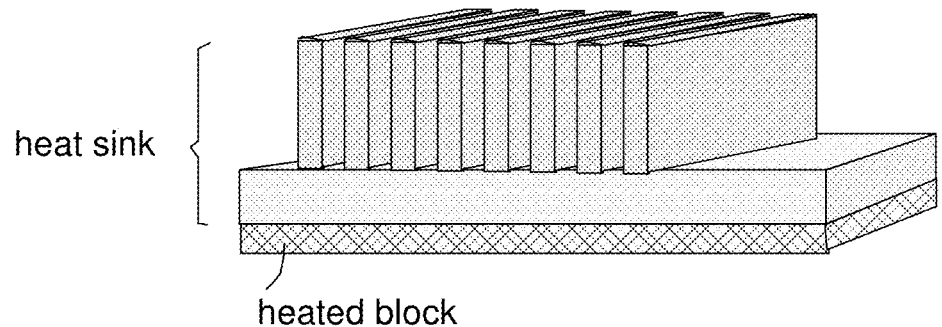
FIG. 8 Schematic of a heat sink supported by a heated block that simulates a heat source.

In order to evaluate and compare the heat-dissipating capabilities of various heat sinks, we proceeded to conduct the following experiment. A heated block is used to support a heat sink in thermal contact therewith, as shown in FIG. 8. In each case, the heated block was immersed in boiling water for 5 minutes to reach a thermal equilibrium. The heated block was then taken out of water, rapidly dried, and then brought in thermal contact with a heat sink. We have observed that, in general, a heat sink made from a material with a higher thermal conductivity results in a better heat dissipation capability. However, there are some surprises. For instance, a heat sink made from sample MP-1, composed of NGP-reinforced mesophase pitch (with a thermal conductivity of 162 W/mK), was found to be more effective than an aluminum heat sink (K=185 W/mK) by a big margin (the temperature of the heated block dropped to 67° C. (MP-1) vs. 86° C. (Al) after 3 minutes of exposure to the same ambient air).

In conclusion, we have successfully developed a heat sink made of a new, novel, unexpected, and patently distinct class of highly conducting material. These nanographene platelet-reinforced composites have the best combination of excellent electrical conductivity, thermal conductivity, mechanical strength, and low physical density that no prior art graphitic materials have been able to achieve.

We claim:

1. A process for producing a nanographene platelet-reinforced composite material comprising
   a. providing a plurality of nanographene platelets;
   b. bonding said nanographene platelets with an adhesive material to form a porous preform having a three-dimensional network of continuous electron- and phonon-conducting paths;
   c. impregnating said porous preform with a matrix material to form an impregnated preform; and
   d. solidifying said impregnated preform to produce said nanographene platelet-reinforced composite material.

2. The process of claim 1, further comprising a step of compression, before or after said step of impregnating said porous preform.

3. The process of claim 1, further comprising a step of heat treatment at a temperature from 500° C. to 2,500° C.

4. The process of claim 1, further comprising a step of coating said nanographene platelet-reinforced composite material with a high-emissivity material.

5. The process of claim 4, wherein said high-emissivity material is selected from the group consisting of aluminum oxide, zinc oxide, aluminum nitride, titanium oxide, boron nitride, silicon carbide, silicon nitride, gallium nitride, and combinations thereof.

6. The process of claim 1, further comprising a step of assembling multiple pieces of nanographene platelet-reinforced composite material into a finned unit.

7. The process of claim 1, wherein said nanographene platelets comprise 15 to 90 weight % based on the total composite weight.

8. The process of claim 1, wherein said nanographene platelets have a thickness less than 10 nm.

9. The process of claim 1, wherein said nanographene platelet-reinforced composite material has a thickness from 0.1 mm to 2 mm.

10. The process of claim 1, wherein said adhesive material is different from said matrix material.

11. The process of claim 1, wherein said adhesive material is selected from the group consisting of thermoplastic polymers, UV-curable adhesives, and radiation-curable adhesives.

12. The process of claim 1, wherein said matrix material is selected from the group consisting of phenolic resin, petroleum pitch, mesophase pitch, polymeric carbon, thermoplastic polymers, thermoset resins, elastomeric polymers, interpenetrating network polymers, metals, glass materials, ceramic materials, and combinations thereof.

13. The process of claim 1, further comprising a second discrete reinforcement phase.

14. The process of claim 13, wherein said second reinforcement phase is selected from the group consisting of carbon fibers, graphite fibers, graphite nanofibers, carbon nanotube, carbon nanorod, mesophase carbon particle, mesocarbon microbead, expanded graphite flake, exfoliated graphite or graphite worm, coke particle, needle coke, carbon black, acetylene black particle, activated carbon particle, and combinations thereof.

15. A process for producing a nanographene platelet-reinforced composite material comprising
   a. providing a plurality of nanographene platelets;
   b. bonding said nanographene platelets with an adhesive material to form a shapable porous preform having a three-dimensional network of continuous electron- and phonon-conducting paths;
   c. impregnating said porous preform with a matrix material to form an shapable impregnated preform;
   d. shaping said shapable impregnated preform; and
   e. solidifying said shaped impregnated preform to produce said nanographene platelet-reinforced composite material.

16. The process of claim 15, wherein said adhesive material is not the same as said matrix material.

17. The process of claim 15, further comprising a second discrete reinforcement phase selected from a particle, filament, nanotube, nanowire, or nanorod of a metal, ceramic material, glass material, polymer, carbon, graphite, or a combination thereof.

18. The process of claim 15, wherein said nanographene platelets comprise 15-90 weight % based on the total composite weight.

* * * * *